United States Patent
Kang et al.

(10) Patent No.: US 10,863,134 B2
(45) Date of Patent: Dec. 8, 2020

(54) DISPLAY DEVICE

(71) Applicant: SAMSUNG ELECTRONICS CO., LTD., Suwon-si (KR)

(72) Inventors: Jeong-il Kang, Yongin-si (KR);
Kwang-youn Kim, Suwon-si (KR);
Seong-hoon Woo, Suwon-si (KR);
Du-hee Jang, Suwon-si (KR);
Hyun-young Jang, Yongin-si (KR);
Shin-wook Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/878,083

(22) Filed: Jan. 23, 2018

(65) Prior Publication Data
US 2018/0227537 A1  Aug. 9, 2018

(30) Foreign Application Priority Data

Feb. 6, 2017 (KR) .................. 10-2017-0016102
Apr. 3, 2017 (KR) .................. 10-2017-0042947

(51) Int. Cl.
| | | |
|---|---|---|
| G08B 5/36 | (2006.01) | |
| H04N 5/655 | (2006.01) | |
| H04N 5/64 | (2006.01) | |
| H05K 5/02 | (2006.01) | |
| G06F 1/16 | (2006.01) | |
| H04N 5/63 | (2006.01) | |

(52) U.S. Cl.
CPC .......... *H04N 5/655* (2013.01); *G06F 1/1605* (2013.01); *G06F 1/1683* (2013.01); *H04N 5/63* (2013.01); *H04N 5/64* (2013.01); *H04N 5/642* (2013.01); *H05K 5/0234* (2013.01); *H05K 5/0247* (2013.01)

(58) Field of Classification Search
CPC ............ H04N 5/655; H04N 5/64; H04N 5/63; H04N 5/642; G06F 1/1605; G06F 1/1683; H05K 5/0234; H05K 5/0247
See application file for complete search history.

(56) References Cited

U.S. PATENT DOCUMENTS

| | | |
|---|---|---|
| 7,983,029 B2 | 7/2011 | Park |
| 8,167,253 B2 | 5/2012 | Smith |
| 8,823,883 B2 | 9/2014 | Kim et al. |

(Continued)

FOREIGN PATENT DOCUMENTS

| | | |
|---|---|---|
| JP | 5-21120 A | 1/1993 |
| JP | 2009-69523 A | 4/2009 |

(Continued)

OTHER PUBLICATIONS

Communication dated May 8, 2018 issued by the European Patent Office in counterpart Application No. 17209761.0.

(Continued)

*Primary Examiner* — Howard D Brown, Jr.
(74) *Attorney, Agent, or Firm* — Sughrue Mion, PLLC

(57) ABSTRACT

A display device is provided, which includes a display main body, a support configured to support the display main body, and the support being made of a transparent material, and a stand coupled to a lower portion of the support, wherein the display main body is configured to receive a power supply through the stand and the support.

20 Claims, 22 Drawing Sheets

(56) References Cited

U.S. PATENT DOCUMENTS

| | | | |
|---|---|---|---|
| 2008/0224142 A1* | 9/2008 | Cheng | H01L 27/1288 257/59 |
| 2009/0140218 A1 | 6/2009 | Inaba et al. | |
| 2011/0149181 A1* | 6/2011 | Kim | F16M 11/18 348/836 |
| 2012/0268449 A1* | 10/2012 | Choi | H05K 5/0234 345/214 |
| 2014/0375899 A1* | 12/2014 | Ozeki | G02B 6/009 348/791 |
| 2016/0014390 A1* | 1/2016 | Ligtenberg | H01R 13/641 348/46 |

FOREIGN PATENT DOCUMENTS

| | | |
|---|---|---|
| KR | 10-0955480 B1 | 4/2010 |
| KR | 10-1666916 B1 | 10/2016 |

OTHER PUBLICATIONS

Communication dated Nov. 15, 2019, from the European Patent Office in counterpart European Application No. 17209761.0.
Communication dated Jun. 22, 2020 by the European Patent Office in counterpart European Patent Application No. 17209761.0.

\* cited by examiner

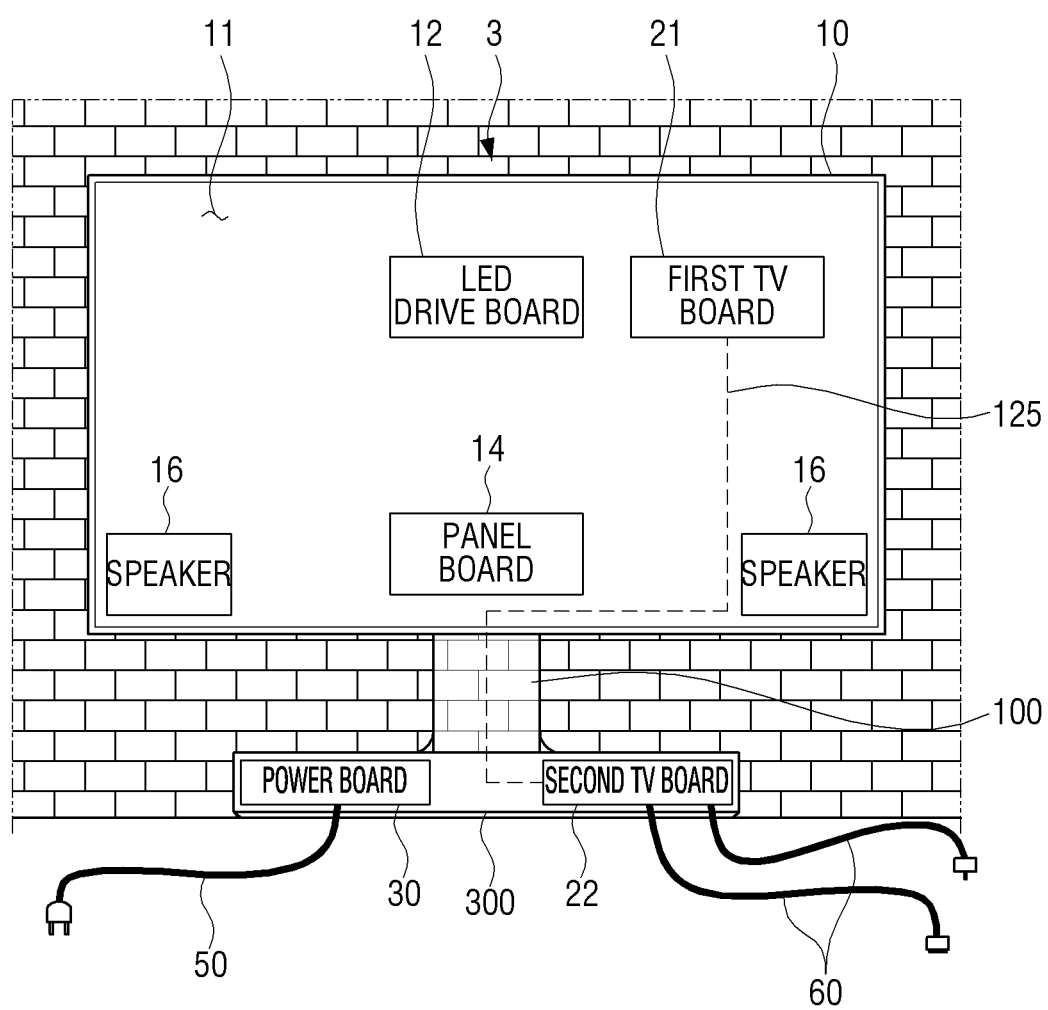

US 10,863,134 B2

DISPLAY DEVICE

CROSS-REFERENCE TO RELATED APPLICATIONS

This application claims priority from Korean Patent Application Nos. 10-2017-0016102 and 10-2017-0042947 filed on Feb. 6, 2017 and Apr. 3, 2017, respectively, in the Korean Intellectual Property Office, the disclosure of which is incorporated herein by reference in its entirety.

BACKGROUND OF THE INVENTION

Field of the Invention

The present disclosure relates to a display device, and more particularly to a display device having an invisible stand.

Description of the Related Art

With the development of display panel technology, the thickness of a television receiver (TV) becomes gradually thinner, and an ultra-thin TV has recently been commercialized.

In accordance with an installation type, a TV may be classified into a wall mount type and a stand type. By removal of a stand, the stand type may be used as the wall mount type. The wall mount type TV may be directly mounted on an indoor wall surface, and the stand type TV may be installed on an indoor floor or on decorative furniture.

The stand type TV is provided with a stand having a support for supporting a main body of the TV. In this case, since such a support is exposed to a user's eye, it may be unpleasant to the user's eye while the user views the TV, and may be an obstacle in implementing an elegant design. Not only the support but also a plurality of cables connected to the rear portion of the main body of the TV may be exposed to the user's eye. In the same manner as the support, the plurality of cables may spoil the beauty of the TV.

Specifically, in the case of separately deploying the existing speaker externally to the TV in order to manufacture the TV with a thinner thickness, signal cables and a power cable for connecting the TV and the speaker with each other may be exposed to the outside of the TV to obstruct the user from viewing the TV.

SUMMARY OF THE INVENTION

Exemplary embodiments of the present disclosure overcome the above disadvantages and other disadvantages not described above, and provide a display device having a support that is invisible to a user.

Further, exemplary embodiments of the present disclosure provide a display device in which a part of a power board is deployed in a stand and a power cable is connected to the stand.

Further, exemplary embodiments of the present disclosure provide a display device in which a display main body and a speaker are connected through transparent cables that are invisible to a user as if the speaker could operate without any separate cable like a wireless external speaker.

According to an aspect of the present disclosure, a display device includes a display main body; a support configured to support the display main body, the support being made of a transparent material; and a stand coupled to a lower portion of the support, wherein the display main body is configured to receive a power supply through the stand and the support.

The support may include a body made of an insulator; a conducting wire deployed to the body, the conducting wire being made of an electrical conductor; and a cover made of an insulator surrounding the conducting wire.

The conducting wire may be inserted and deployed in the body.

The conducting wire may be deployed on a surface of the body.

The body, the cover, and the conducting wire may be transparently formed.

The conducting wire may be formed of a band-shaped film.

The conducting wire may be formed of one transparent electrode material of indium tin oxide (ITO), fluorine tine oxide (FTO), metal mesh, and high polymer.

Both ends of the conducting wire may be exposed.

Metal electrodes may be formed at the both ends of the conducting wire.

A part of a power board may be deployed in the display main body, and a remainder of the power board may be deployed in the stand.

The stand may be connected to a power cable configured to supply power from an external power supply.

A power board may be deployed in the stand.

A part of a TV board may be deployed in the display main body, and a remainder of the TV board may be deployed in the stand.

The stand may be connected to a TV signal cable configured to transmit a TV signal.

The part of the TV board deployed in the display main body and a part of the remainder of the TV board deployed in the stand may be connected to each other through a transparent optical cable.

The stand may further include an optical cable accommodation groove concavely formed on a surface of a body of the stand, wherein the transparent optical cable is accommodated therein.

A first mount grooves may be formed on the display main body is coupled to one end of the support and a second mount groove formed on the stand is coupled to another end of the support.

A first connection terminal may be deployed in the first mount groove, and a second connection terminal is deployed in the second mount groove.

The display device according to the aspect of the present disclosure may further include a speaker deployed separately from the display main body; and a transparent transmission cable configured to transmit power and a signal from the display main body to the speaker.

The transmission cable may include a transparent plate made of an insulator; and a transparent power line deployed on a surface of the plate, wherein the transparent plate includes a core configured to transmit an optical audio signal from the display main body to the speaker, and a core cover deployed on an outside of the core.

The transparent plate may include a first surface and a second surface, and the transparent power line may be deployed on one surface or both surfaces of the first surface and the second surface of the transparent plate.

The transmission cable may include a plate made of an insulator and formed of a transparent material; and a power line deployed on a surface of the plate and formed of a transparent material, wherein an optical cable transmitting an optical signal is inserted and deployed inside the plate in order to transmit a signal from the display main body to the speaker.

The transparent transmission cable may include a first transparent cable configured to supply the power from the display main body to the speaker; and a second transparent cable configured to transmit a signal from the display main body to the speaker.

The first transparent cable may include a transparent conducting wire; and a transparent support body configured to support the transparent conducting wire.

Additional and/or other aspects and advantages of the disclosure will be set forth in part in the description which follows and, in part, will be obvious from the description, or may be learned by practice of the disclosure.

BRIEF DESCRIPTION OF THE DRAWING FIGURES

The above and/or other aspects of the present disclosure will be more apparent by describing certain exemplary embodiments of the present disclosure with reference to the accompanying drawings, in which:

FIG. 7 is a view illustrating a display device according to still another embodiment of the present disclosure;

DETAILED DESCRIPTION OF THE EXEMPLARY EMBODIMENTS

Figure 1:
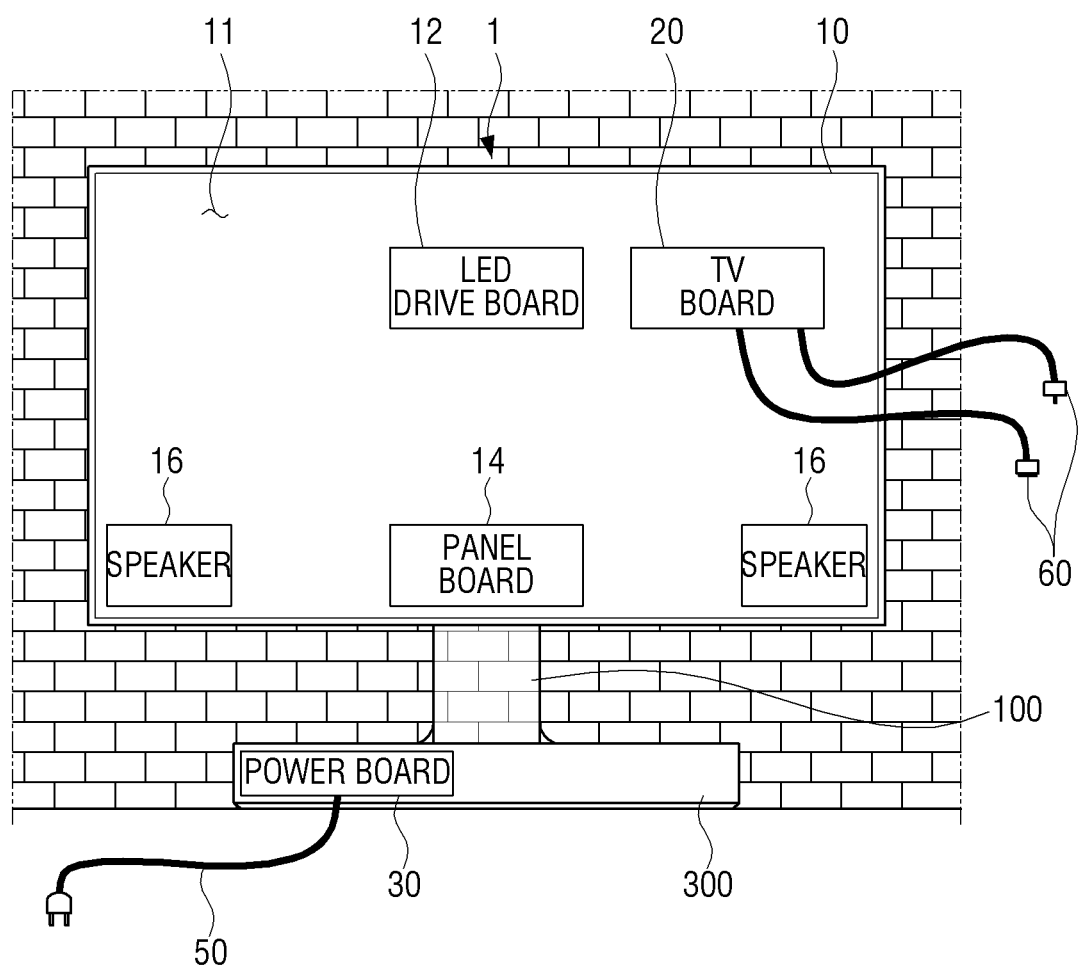
FIG. 1 is a diagram illustrating a display device according to an embodiment of the present disclosure.

Hereinafter, a display device according to preferred embodiments of the present disclosure will be described in detail with reference to the accompanying drawings.

The embodiments described hereinafter are exemplary to help understanding of the present disclosure, and it should be understood that the present disclosure may include various modifications, equivalents, and/or alternatives of the embodiments of the present disclosure. In describing the present disclosure, related well-known functions or constituent elements are not described in detail since they would obscure the subject matter of the present disclosure in unnecessary detail. Further, in order to help understanding of the present disclosure, sizes of some constituent elements illustrated in the drawings may be exaggerated for clarity in explanation.

In the present disclosure, "transparent" means that the whole or a part of light is penetrable, and includes 'semi-transparent'. When light passes through an object, one of absorption, reflection, and penetration may occur, and if the object has permeability, it may be transparent.

In this embodiment, a display device may be a liquid crystal display (LCD) panel, a plasma display panel (PDP) panel, an organic light emitting diode (OLED) panel, or a thin or ultrathin TV using a nano quantum panel.

Hereinafter, a display device according to an embodiment of the present disclosure will be described, and then a stand 300 included in the display device will be described in detail. FIG. 1 is a diagram illustrating a display device according to an embodiment of the present disclosure.

Referring to FIG. 1, a display device 1 according to an embodiment of the present disclosure includes a display main body 10 provided with a screen 11, a support 100 supporting the display main body 10 in an upright state, and a stand 300 coupled to a lower portion of the support 100.

The display main body 10 may display an image, and if it has an embedded speaker, it may output sound corresponding to the image.

The support 100 has an upper end portion coupled to a lower side of the display main body 10 to support the weight of the display main body 10, and a lower end portion coupled to the stand 300. In this case, the stand 300 may stably support the display main body 10 through dispersion of the weight of the display main body 10 that is transferred through the support 100.

The support 100 may be formed of a transparent material. As the support 100 is transparently formed, it is invisible, and thus a user can heighten concentration on the image in contrast with the related art provided with an opaque support.

The support 100 may be inserted into and coupled to a mount groove 200 of the stand 300 to be described later. Specifically, the support 100 may be inserted into and fastened to the stand 300 by screws (not illustrated).

The stand 300 may be formed in the shape of a plate having a specific width, and the mount groove 200, into which the lower end portion of the support 100 can be inserted, may be formed on a center portion thereof.

The support 100 may be electrically connected to the stand 300 and the display main body 10. Accordingly, an external power can be supplied to the display main body 10 through the stand 300 and the support 100.

Referring to FIG. 1, circuit boards may include an LED drive board 12, a TV board 20, and a panel board 14.

The LED drive board 12 provides constant current corresponding to a brightness value to an LED so that a backlight operates with a brightness value corresponding to dimming information provided from the TV board 20.

The TV board 20 receives a video signal, an audio signal, and an additional information signal that are applied from an outside through a signal cable. Signal processing, such as video decoding, video scaling, and audio decoding, is performed with respect to the received video and audio signals. Further, the TV board 20 provides the video signal to the panel board 14, and provides the audio signal to a speaker 16.

Accordingly, the panel board 14 displays thereon various kinds of information provided from the display device 1 and an image transferred from the TV board 20.

Further, the speaker 16 converts the audio signal output from the TV board 20 into sound to output the converted sound.

The screen 11 of the display main body 10 displays the image using an LED backlight. The LED drive board 12, the TV board 20, and the panel board 14 receive necessary power through a power board 30.

The power board 30 supplies the power to respective constituent elements in the display device 1. Specifically, the power board 30 provides the power to the LED drive board 12, the TV board 20, and the panel board 14.

The detailed internal circuit of the power board 30 will be described later with reference to FIG. 2.

On the other hand, in an illustrated example, it has been explained that the power board 30 supplies the power only to the LED drive board 12, the TV board 20, and the panel board 14. However, the power board 30 may provide the power to all constituent elements that require the power in the display device 1.

Referring to FIG. 1, the power board 30 is deployed on the stand 300 of the display device 1 according to an embodiment of the present disclosure. Specifically, the power board 30 is deployed inside the stand 300. The power board 30 is electrically connected to the support 100 through a partial region of the mount groove 200 into which the support 100 is inserted.

Accordingly, a power cable 50 connected to the power board 30 is connected to the stand 300. In the related art, since the power cable 50 is connected to the display main body, the power cable 50 that is exposed from the screen 11 is visible to the eye, and this may obstruct viewer's immersion and spoil the overall external appearance of the display device 1. However, in an embodiment of the present disclosure, the display device 1 is configured so that the power cable 50 is connected to the stand 300. Accordingly, while viewing the image, a user mainly gazes at the screen 11 of the display main body 10, and thus the power cable 50 connected to the stand 100 that is apart from the display main body 10 may be invisible to the user's eye. Accordingly, it becomes possible to solve the problem that the power cable is directly connected to the display main body 10 to obstruct the viewer's immersion.

Figure 2:
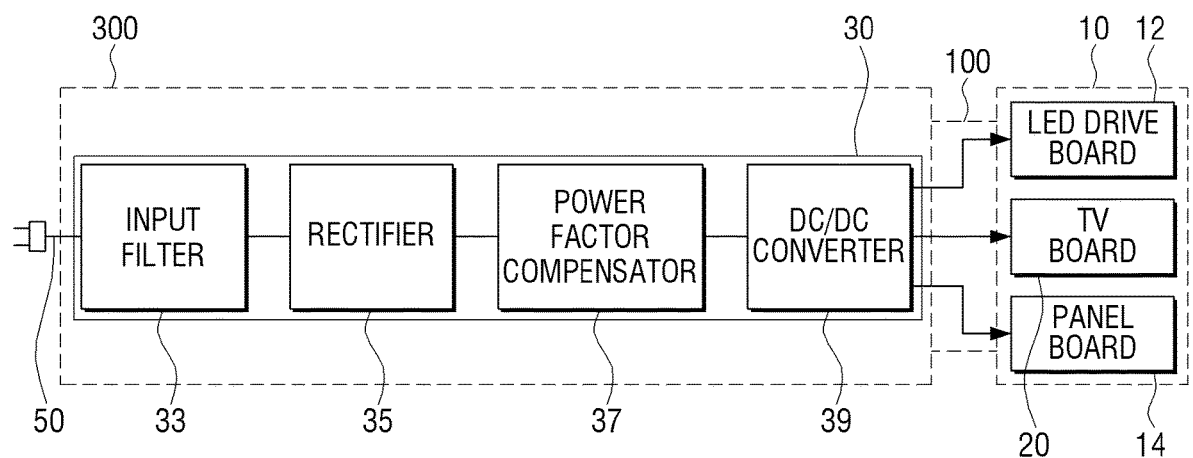
FIG. 2 is a block diagram of an internal circuit of a display device according to an embodiment of the present disclosure.

FIG. 2 is a block diagram of an internal circuit of a display device according to an embodiment of the present disclosure.

Referring to FIG. 2, the power board 30 may include an input filter 33, a rectifier 35, a power factor compensator 37, and a DC/DC converter 39.

The input filter 33 may be connected to an AC input power through the power cable 50. The input filter 33 may serve to attenuate high-frequency noises generated from the outside and inside. The rectifier 35 is connected to the input filter 33 to rectify the AC power that has passed through the input filter 33 into a DC power. The power factor compensator 37 supplies a power factor compensation voltage through stable boosting of the power to the DC/DC converter 39. The DC/DC converter 39 may output several levels of DC power required in the display device 1. Specifically, the DC/DC converter 39 may output the power of the LED drive board 12, the power of the TV board 20, and the power of the panel board 14.

In the display device 1 according to an embodiment of the present disclosure, the power board 30 may be deployed on the stand 300. Specifically, the input filter 33, the rectifier 35, the power factor compensator 37, and the DC/DC converter 39 may be formed in the stand 300 as a whole.

Accordingly, the power cable 50 that is connected to a general outlet for providing a power of rated capacity may be connected to the stand 300. Multiple DC power outputs from the power board 30 may be supplied to respective circuit boards of the display main body 10 through the support 100. Specifically, the respective DC power outputs may be supplied to the LED drive board 12, the TV board 20, or the panel board 14. Accordingly, the support 100 electrically connects the stand 300 and the display main body to each other.

Figure 3A:
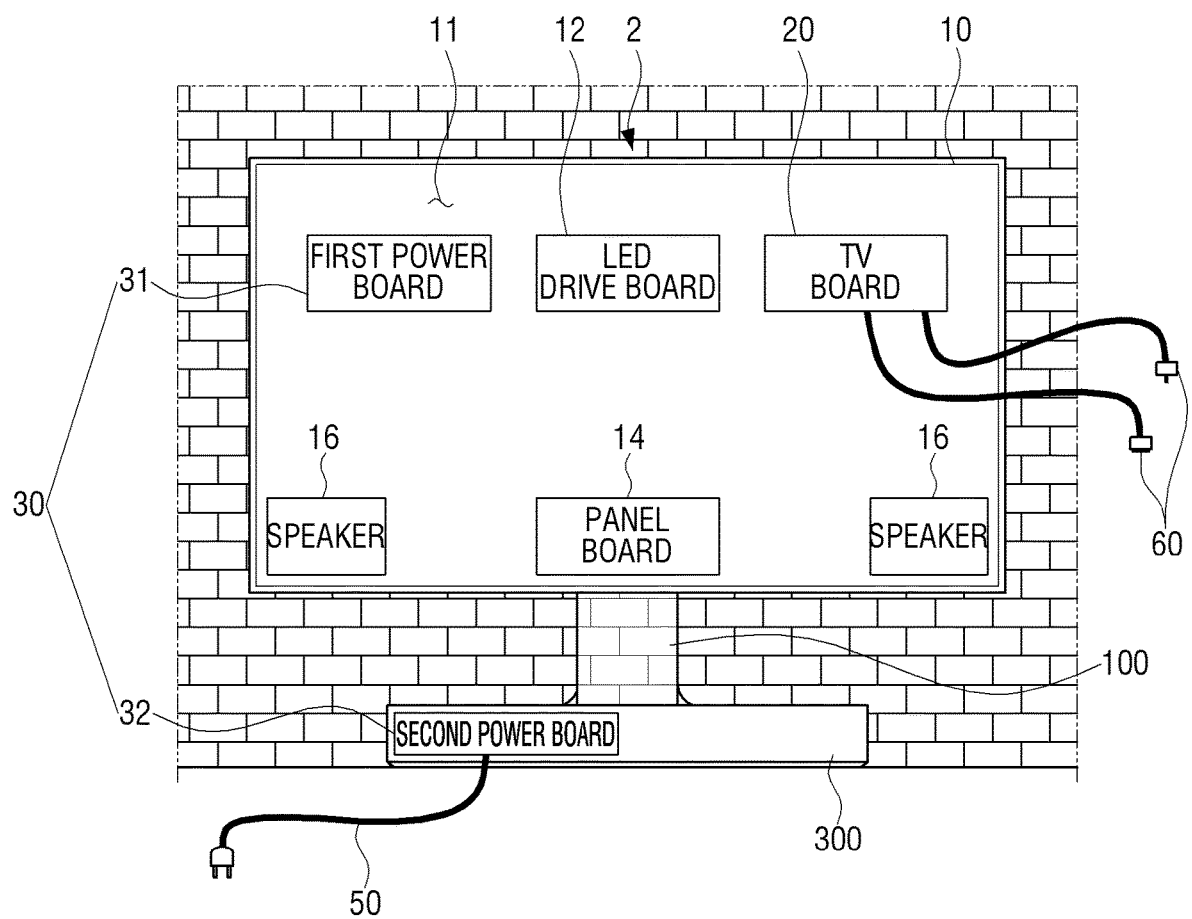
FIG. 3A is a diagram illustrating a display device according to another embodiment of the present disclosure.

FIG. 3A is a diagram illustrating a display device according to another embodiment of the present disclosure.

Referring to FIG. 3A, in a display device 2 according to another embodiment of the present disclosure, the power board 30 for supplying the power to the display device 2 may be dividedly arranged. Specifically, a first power board 31 that is a part of the power board 30 may be arranged in the display main body 10, and a second power board 32 that is the remainder of the power board 30 may be arranged in the stand 300.

In this case, the power cable 50 that is connected to a general outlet for providing a power of rated capacity may be connected to the stand 300. As a smaller number of cables are exposed to the outside of the display main body 10, the user's immersion on the image may be increased. Further, during installation of the display device 2, the user can neatly arrange the power cable 50 connected to the stand 300, and thus interior effects of the overall display device 2 can be improved.

Figure 3B:
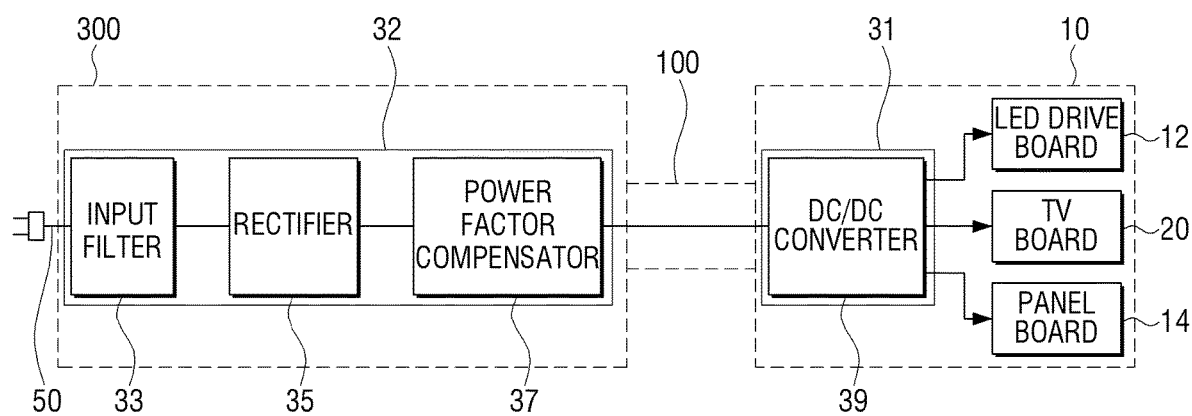
FIG. 3B is a block diagram of an internal circuit of a display device according to another embodiment of the present disclosure.

FIG. 3B is a block diagram of an internal circuit of a display device according to another embodiment of the present disclosure.

Referring to FIG. 3B, in a display device 2 according to another embodiment of the present disclosure, the power board 30 may be divided into a first power board 31 and a second power board 32.

The first power board 31 includes the DC/DC converter 39. The first power board 31 is deployed inside the display main body 10. A plurality of DC power outputs from the DC/DC converter 39 of the first power board 31 is transferred to the circuit boards, such as the LED drive board 12, the TV board 20, and the panel board 14, that require the power outputs in the display device 2.

The second power board 32 includes an input filter 33, the rectifier 35, and the power factor compensator 37. The second power board 32 is deployed inside the stand 300. The power cable 50 that is connected to a general outlet to receive an AC power is connected to the input filter 33. Accordingly, the power cable 50 is connected to the stand 300 and is deployed to be exposed from the stand 300.

The external power transmitted by the power cable 50 may be supplied to the display device 2 through the first and second power boards 31 and 32. The first power board 31 and the second power board 32 are electrically connected to each other through the support 100. In this case, a power factor compensation voltage output from the power factor compensator 37 included in the second power board 32 can be supplied to the DC/DC converter 39 included in the first power board 31 through the support 100.

FIG. 3B illustrates a case where the power board 30 is divided into the first power board 31 including the DC/DC converter 39 and the second power board 32 including the input filter 33, the rectifier 35, and the power factor compensator 37, but is not limited thereto. Considering that the first power board 31 and the second power board 32 are connected to each other via the support 100, constituent elements included in the first and second power boards 31 and 32 may be divided in various methods.

Figure 4A:
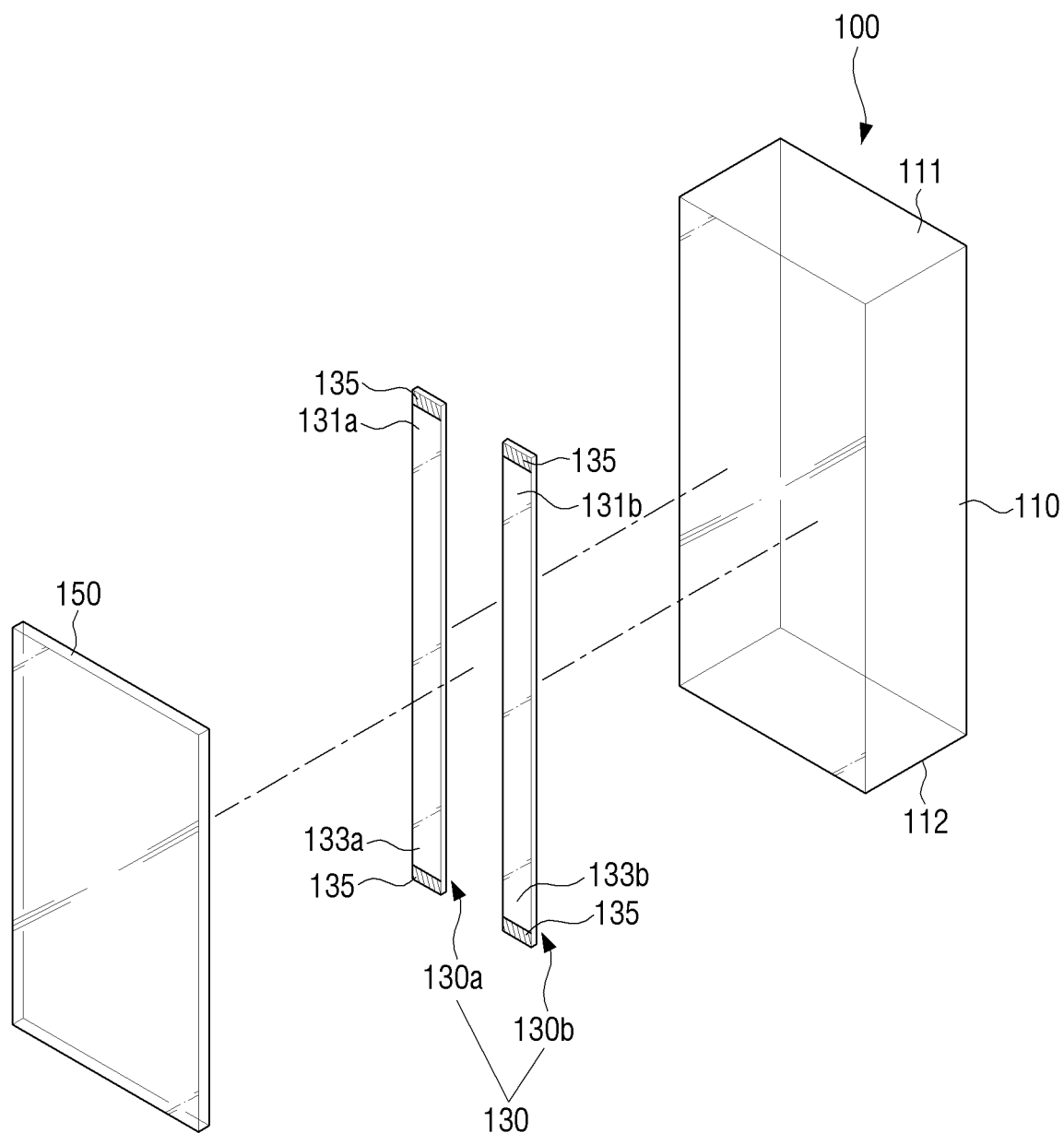
FIGS. 4A and 4B are an exploded perspective view and a combined perspective view illustrating a support according to an embodiment of the present disclosure.
Figure 4B:
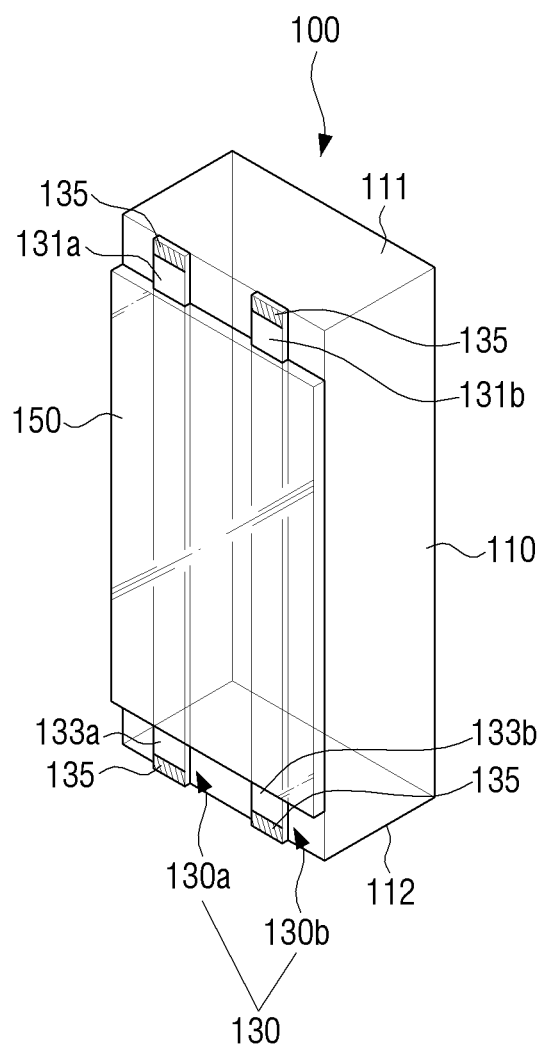

FIGS. 4A and 4B are an exploded perspective view and a combined perspective view illustrating a support according to an embodiment of the present disclosure.

Referring to FIGS. 4A and 4B, the support 100 according to an embodiment of the present disclosure is deployed between the display main body 10 and the stand 300, and electrically connects the display main body 10 and the stand 300 to each other as described above.

The support 100 may include a body 110 made of an insulator, a conducting wire 130 deployed on the body 110 and made of an electrical conductor, and a cover 150 made of an insulator surrounding the conducting wire 130.

The body 110, the conducting wire 130, and the cover 150, which constitute the support 100, may be formed of a transparent material in all. In this case, since the support 100 is transparently formed, it may have an effect as if the screen 11 was floating in the air.

In an embodiment of the present disclosure, the display device 1 has a stable structure supported on the floor, and provides an environment in which a user can concentrate on an image through lowering of visibility of the support 100 connected to the display main body 10. The body 110 is formed of a transparent material. Specifically, the body 110 may be formed of glass or plastic. The body 110 may be produced in the shape of a rectangular plate. However, the body 110 is not limited to the rectangular shape, but may have any shape so far as it can stably support the display main body 10 through dispersion of the weight of the display main body 10.

The upper end portion 111 of the body 110 is fixedly inserted into the display main body 10, and the lower end portion 112 thereof is fixedly inserted into a mount groove 200 of the stand 300. The display main body 10 is supported in an upright state by the support 100.

The conducting wire 130 transmits an output of the power board 30 formed on the stand 300 to the display main body 10. Accordingly, as shown in FIG. 1, the support 100 may supply a power output from the power board 30 of the stand 300 to the display main body 10.

The conducting wire 130 may be formed of a thin film having conductivity. Specifically, the conducting wire 130 may be formed of indium tin oxide (ITO), fluorine tin oxide (FTO), metal mesh, or high polymer, or may be formed of other conductive materials.

A plurality of conducting wires 130a and 130b may be deployed on the body 110. The wire 130 is to transfer the power output from the power board 30 to an external circuit board, and a plurality of conducting wires including a voltage output terminal 130a and a ground terminal 130b may be formed.

On the other hand, FIG. 4A exemplarily illustrates two conducting wires 130a and 130b. However, the number of conducting wires is not limited thereto, but more than two conducting wires may be provided.

The respective conducting wires 130a and 130b may be arranged in parallel. The plurality of conducting wires 130a and 130b are formed on the surface of the body 110. Specifically, the conducting wire 130 may be formed on the surface of the body 110 in a coating or bonding method.

The cover 150 covers the surface of the body 110 to surround the conducting wire 130. The cover 150 is to prevent a user from getting shocked or to prevent a circuit from malfunctioning. The cover 150 may be formed through insulated coating of the conducting wire 130. The cover 150 may be formed of a transparent insulator.

One end 131a or 131b of the conducting wire 130 is electrically connected to a circuit board deployed on the display main body 10, and the other end 133a or 133b of the conducting wire 130 is connected to at least a part of the power board 30 deployed on the stand 300. Both ends 131 and 133 of the conducting wire 130 are exposed to serve as contacts in the case where the display main body 10 and the stand 300 are connected to each other.

In this case, the cover 150 covers the remainder excluding the both ends 131 and 133 of the conducting wire 130 so that the both ends 131 and 133 of the conducting wire 130 are exposed. Further, the both ends 131 and 133 of the conducting wire 130 may include a metal material. The metal material is a material having high conductivity, and may be coated on the both ends 131 and 133 of the conducting wire 130. Accordingly, as shown in FIG. 1, the support 100 may be electrically connected to the circuit board 12, 20, or 14 of the display main body 10 and the power board 30 of the stand 300.

Hereinafter, the structure of a support according to another embodiment of the present disclosure will be described. The same reference numerals are used for the same constituent elements as those according to the embodiment as described above, and the explanation thereof will be omitted.

Figure 5:
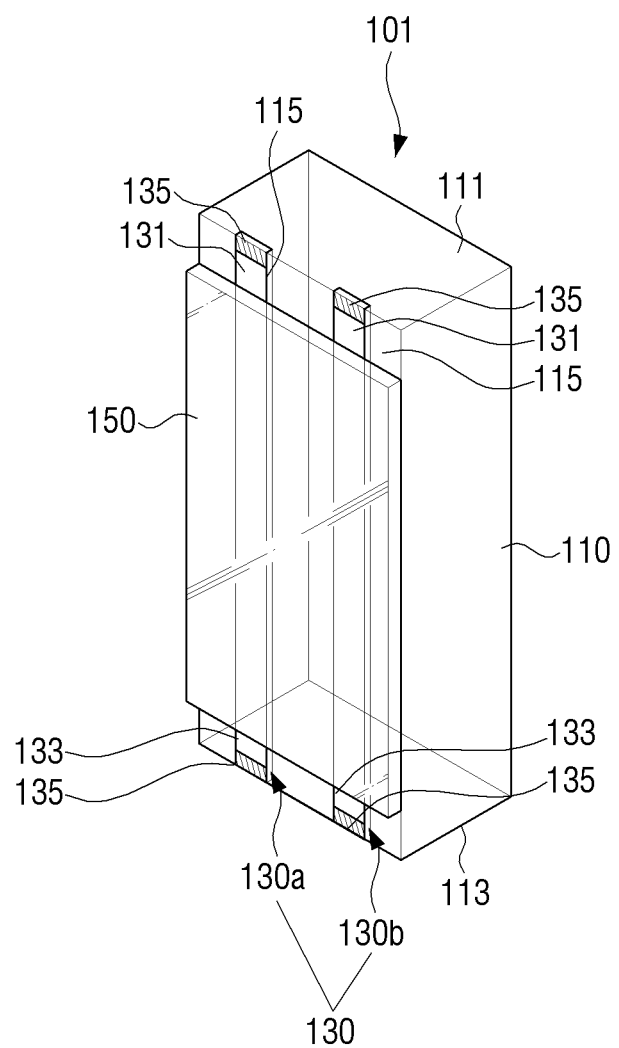
FIG. 5 is a view illustrating a support according to another embodiment of the present disclosure.

FIG. 5 is a view illustrating a support according to another embodiment of the present disclosure.

Referring to FIG. 5, a support 101 according to another embodiment of the present disclosure may have the conducting wire 130 deployed inside the body 110 in contrast with the support 100 as illustrated in FIG. 4 according to an embodiment of the present disclosure.

The body 110 includes a conductor accommodation groove 115 concavely formed on a surface of the body 110 so that the conducting wire 130 can be deployed therein. In the conductor accommodation groove 115, the conducting wire 130 that is a transparent electrode may be coated or bonded.

The conducting wire 130 may be made of a conductive transparent material in the form of a liquid paint. In this case, the conducting wire 130 may be formed by applying a liquid conductive transparent material into the conductor accommodation groove 115. The conducting wire 130 is not limited to the thin film as described above or the liquid paint, but may be formed of any material so far as it is formed of a conductive transparent material capable of transferring electricity. In order for the support 101 to smoothly achieve an electrical connection between the display main body 10 and the stand 300, a metal material 135 may be deployed at both ends 131 and 133 of the conducting wire 130.

In the same manner as the embodiment illustrated in FIG. 4A, the cover 150 is formed to surround the conducting wire 130 in order to prevent the user from getting shocked or to prevent the circuit from malfunctioning. In this case, the both ends 131 and 133 of the conducting wire 130 that form contacts connecting to the external circuit board are not covered by the cover 150, but are exposed.

Figure 6:
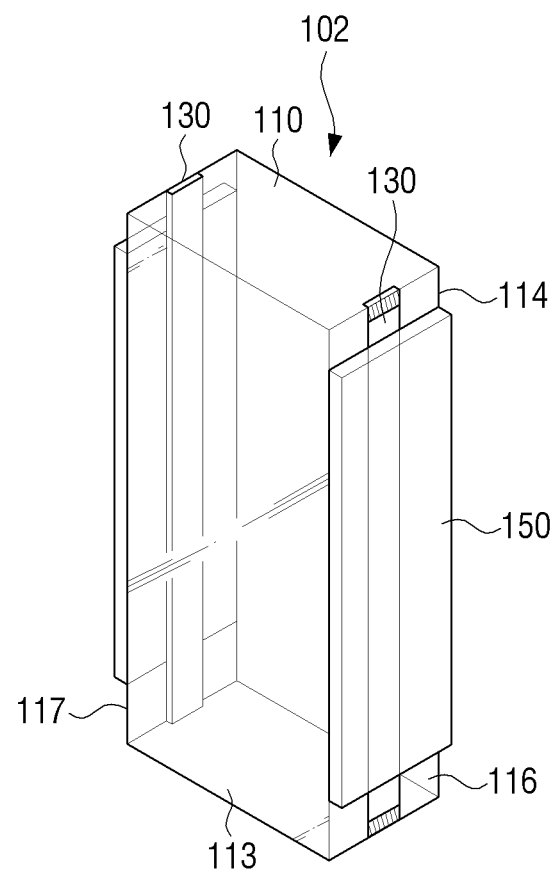
FIG. 6 is a view illustrating a support according to still another embodiment of the present disclosure.

FIG. 6 is a view illustrating a support according to still another embodiment of the present disclosure.

Referring to FIG. 6, a support 102 according to still another embodiment of the present disclosure may have a conducting wire 130 formed on side surfaces 116 and 117 of the support 102.

Like the supports 100 and 101 as disclosed in FIGS. 4A and 5, the conducting wire 130 may be formed on an upper surface 113 or a lower surface 114 of the body 110, but is not limited thereto. The conducting wire 130 may be formed on the side surfaces 116 and 117 of the body 110.

FIG. 6 exemplarily illustrates that the conducting wire 130 is deployed on the inside of the body 110, but is not limited thereto. The conducting wire 130 may also be formed to be attached to the side surfaces 116 and 117 of the body 110.

FIG. 7 is a view illustrating a display device according to still another embodiment of the present disclosure.

Referring to FIG. 7, in a display device 3 according to still another embodiment of the present disclosure, not only the power board 30 but also a part of the TV board that receives a signal from an outside may be deployed to the stand 300.

In the display device 3 according to still another embodiment of the present disclosure, the TV board 20 for transferring a signal applied from the outside may be dividedly deployed on the display device 3. Specifically, a first TV board 21 that is a part of the TV board 20 is deployed on the display main body 10, and a second TV board 22 that is the remainder of the TV board 20 may deployed on the stand 300. Since a part of the TV board 20 is deployed on the stand 300, a slimmer display main body 10 can be formed.

In this case, the signal cable 60 connected to an external device (not illustrated) to transfer a signal may be connected to the stand 300.

The first TV board 21 and the second TV board 22 may be connected to each other through an optical cable 125 to transfer a signal applied from the outside from the second TV board 22 to the first TV board 21. In this case, the optical cable 125 may be a transparent optical cable. Since the support 100 connecting the display main body 10 and the stand 300 to each other and the optical cable 125 are transparently formed in all, the user may feel an effect as if the screen 11 was floating in the air.

Figure 8A:
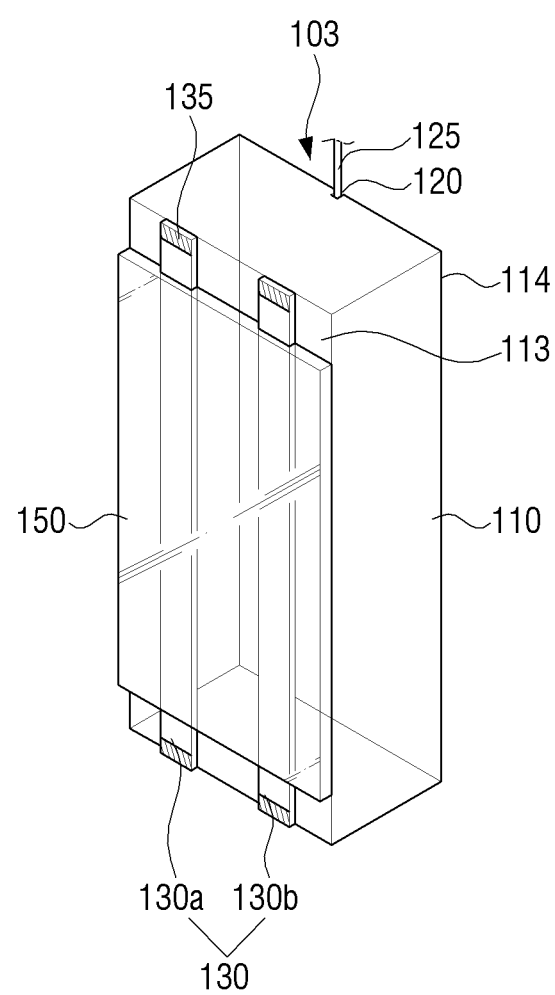
FIGS. 8A and 8B are views illustrating a support of a display device illustrated in FIG. 7 according to various embodiments of the present disclosure.
Figure 8B:
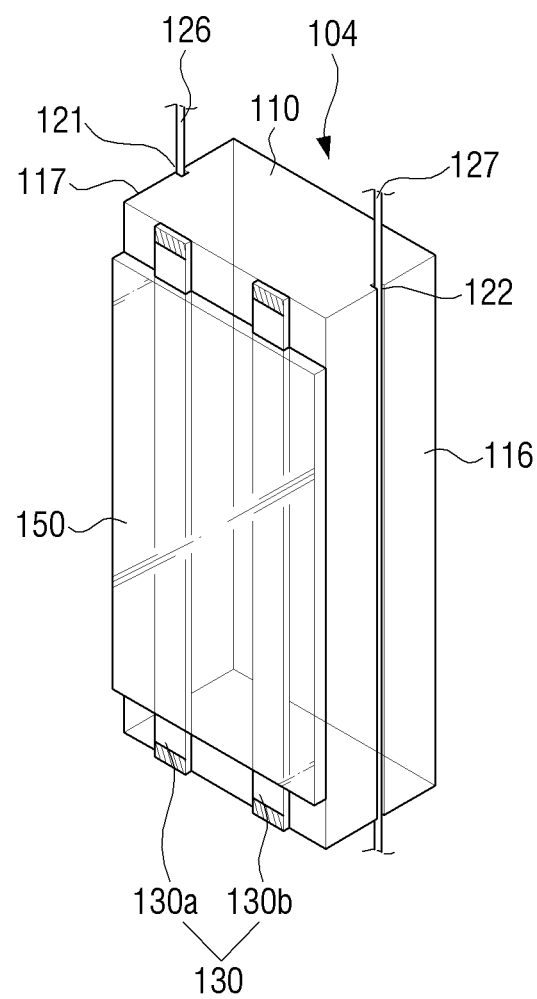

FIGS. 8A and 8B are views illustrating a support of a display device illustrated in FIG. 7 according to various embodiments of the present disclosure.

Referring to FIGS. 8A and 8B, the body 110 of the support 103 or 104 according to another embodiment of the present disclosure may further include optical cable accommodation grooves 120 or 121 and 122 for accommodating the optical cable 125 or 126 and 127.

The optical cable 125 or 126 and 127 is to connect the second TV board 22 formed on the stand 300 and the first TV board 21 formed on the display main body 10 to each other, and is deployed in the optical cable accommodation grooves 120 or 121 and 122.

The optical cable accommodation grooves 120 or 121 and 122 may be concavely formed inside the body 110.

Referring to FIG. 8A, the optical cable accommodation groove 120 may be formed on the lower surface 114 of the body 110. The optical cable accommodation groove 120 may be formed on one surface 113 and an opposite surface 114 of the body 110 on which the conducting wire 130 is formed. If a plurality of optical cables 125 connecting the second TV board 22 and the first TV board 21 to each other are provided, a plurality of optical cable accommodation grooves 120 may be formed corresponding to the optical cables 125.

Referring to FIG. 8B, the optical cable accommodation grooves 121 and 122 may be respectively formed on both side surfaces 116 and 117 of the body 110.

The optical cables 125 or 126 and 127 are deployed in the optical cable accommodation grooves 120 or 121 and 122 so as to be included on one side of the support 103 or 104 to be invisible to the user. Accordingly, the display device 1 having the transparent support 100 that is difficult to be confirmed by the user's naked eye may be provided.

Figure 9A:
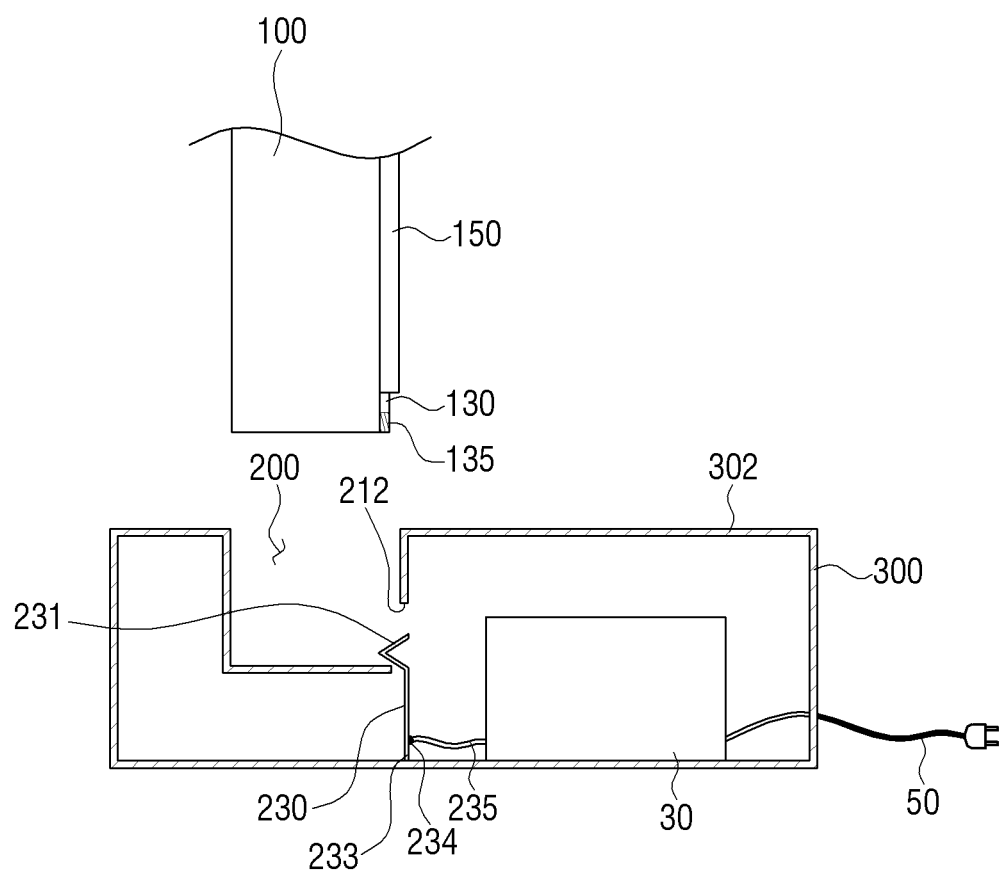
FIG. 9A is a view explaining a case where a support is inserted in and fixed to a stand according to an embodiment of the present disclosure.
Figure 9B:
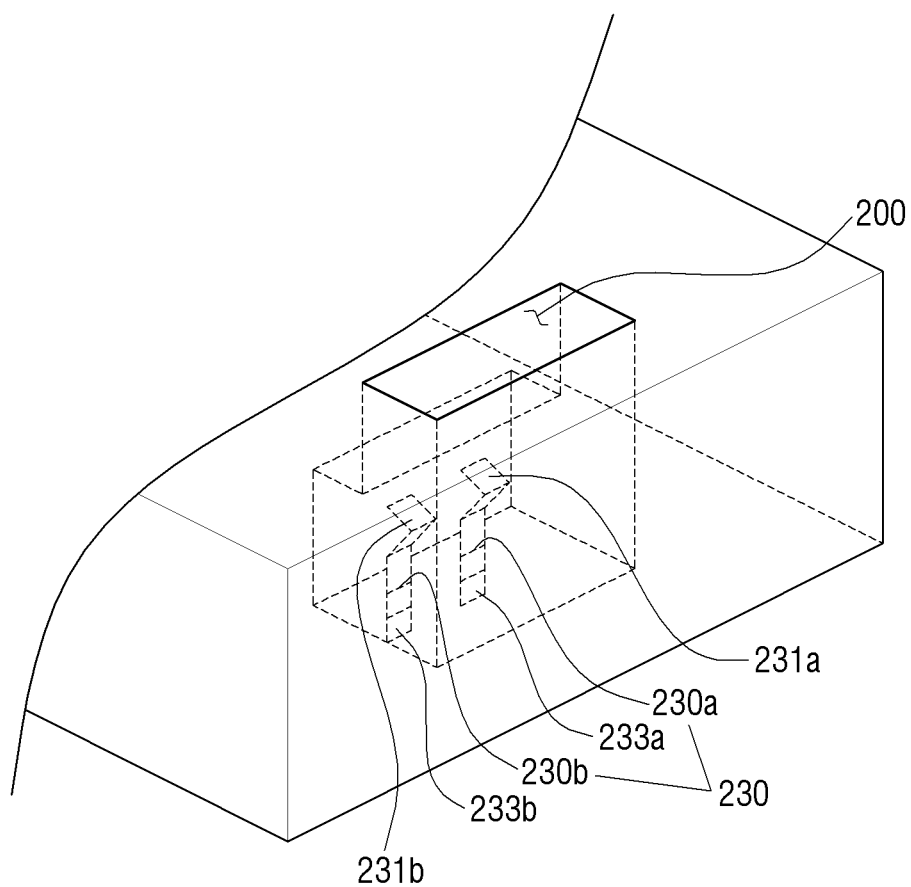
FIG. 9B is a view illustrating a mount groove according to an embodiment of the present disclosure.

FIGS. 9A and 9B are views explaining a case where a support is fixedly inserted into a stand according to an embodiment of the present disclosure.

Referring to FIG. 9A, the support 100 is coupled to a mount groove 200 formed on the stand 300. The mount groove 200 is concavely formed corresponding to the shape of the lower end portion of the support 100. On the inner side surface of the mount groove 200, a plurality of openings 212 are formed to expose a part of the connection terminal 230 deployed on the inside of the stand 300.

Referring to FIG. 9B, the plurality of connection terminals 230a and 230b may be formed corresponding to the number of conducting wires 130a and 130b of the support 100. One end 231 of each of the plurality of connection terminals 230a and 230b may be deployed to be located in the plurality of openings 212. Accordingly, if the lower end portion of the support 100 is inserted into the mount groove 200, the conducting wires 130a and 130b of the support 100 and the one end 231 of each of the plurality of connection terminals 230a and 230b may come in electrical contact with each other.

The connection terminal 230 is to electrically connect the power board 30 deployed at the lower end of the stand 300 and the conducting wire 130 of the support 100 to each other. The connection terminal 230 is formed of a conductive metal material, such as iron. A first contact 231 that is connectable to the support 100 is formed at one end of the connection terminal 230, and a second contact 233 that is connectable to the power board 30 is formed at the other end of the connection terminal 230.

Specifically, the first contact 231 comes in contact with the other end 133 of the conducting wire 130 exposed to the outside to be electrically connected thereto. The second contact 233 is electrically connected to the power board 30 deployed in the stand 300 through an electric wire 235. The power output from the power board 30 deployed on the stand 300 is transferred to the lower portion of the support 100 through the connection terminal 230, and the support 100 may transfer the power transferred from the lower portion to the display main body 10 connected to the upper portion of the support 100.

In the display device 1 according to an embodiment of the present disclosure, the power board 30 is deployed on the stand 300, and the stand 300 and the display main body 10 are electrically connected to each other by the support 100. The display main body 100 may receive the power through the support 100, and the power cable 50 may be connected to the stand 300. Accordingly, the power cable 300 connected from the stand 300 is exposed at a location that is far apart from the display main body 10, and thus the user's immersion on the image may be heightened.

Although FIG. 9A illustrates the mount groove 200 prepared to fixedly support the support 100 on the stand 300, the mount groove 200 may be formed not only on the stand 300 but also at the rear end of the display main body 10 coupled to one end of the support 100. The mount groove 200 is formed even on the display main body 10, and through the mount groove 200, the conducting wire 130 of the support 100 and various kinds of circuit boards 12, 20, and 14 of the display main body 10 are electrically connected to each other.

In FIG. 9A, the mount groove 200 is connected to a case 302 of the stand 300 to be integrally formed with the stand 300. The mount groove 200 may be connected to not only the stand 300 but also the case of the display main body to be integrally formed with the display main body 10.

FIG. 9B is a view illustrating a mount groove according to an embodiment of the present disclosure.

Referring to FIG. 9B, the mount groove 200 is formed so that the upper end portion 111 or the lower end portion 112 of the support 100 can be inserted into the mount groove 200. A plurality of connection terminals 230a and 230b are deployed to be able to come in contact with the inserted support 100.

The connection terminals 230a and 230b electrically connect the circuit board 30 that is deployed on the stand 300 or the display main body 10 to the support 100. Specifically, the first connection terminal 230a may be connected to the first conducting wire 130a, and the second connection terminal 230b may be connected to the second conducting wire 230b.

The connection terminals 230a and 230b include the first contacts 231a and 231b connected to the support 100 and the second contacts 233a and 233b electrically connected to the electric wire to be connected to the circuit board 30. The first contacts 231a and 231b are connected to the metal material 135 of the conducting wire 130, and the second contacts 233a and 233b are connected to the power board 30 of the stand 300 and the plurality of circuit boards 12, 20, and 14 of the display main body 10.

Since the connection of the connection terminal 230 to the mount groove 200 is completed simultaneously with the insertion of the support 100 into the mount groove 200, the display main body 10 and the stand 300 can be simply connected to each other through the support 100.

Further, since the support 100 is inserted into the mount groove 200, the plurality of conducting wires 130 can be collectively connected to the connection terminal 230 of the stand 300 to facilitate the electrical connection between them.

Further, the mount groove 200 may be formed as a separate component that is assembled with the stand 300 or the display main body 10.

Figure 10:
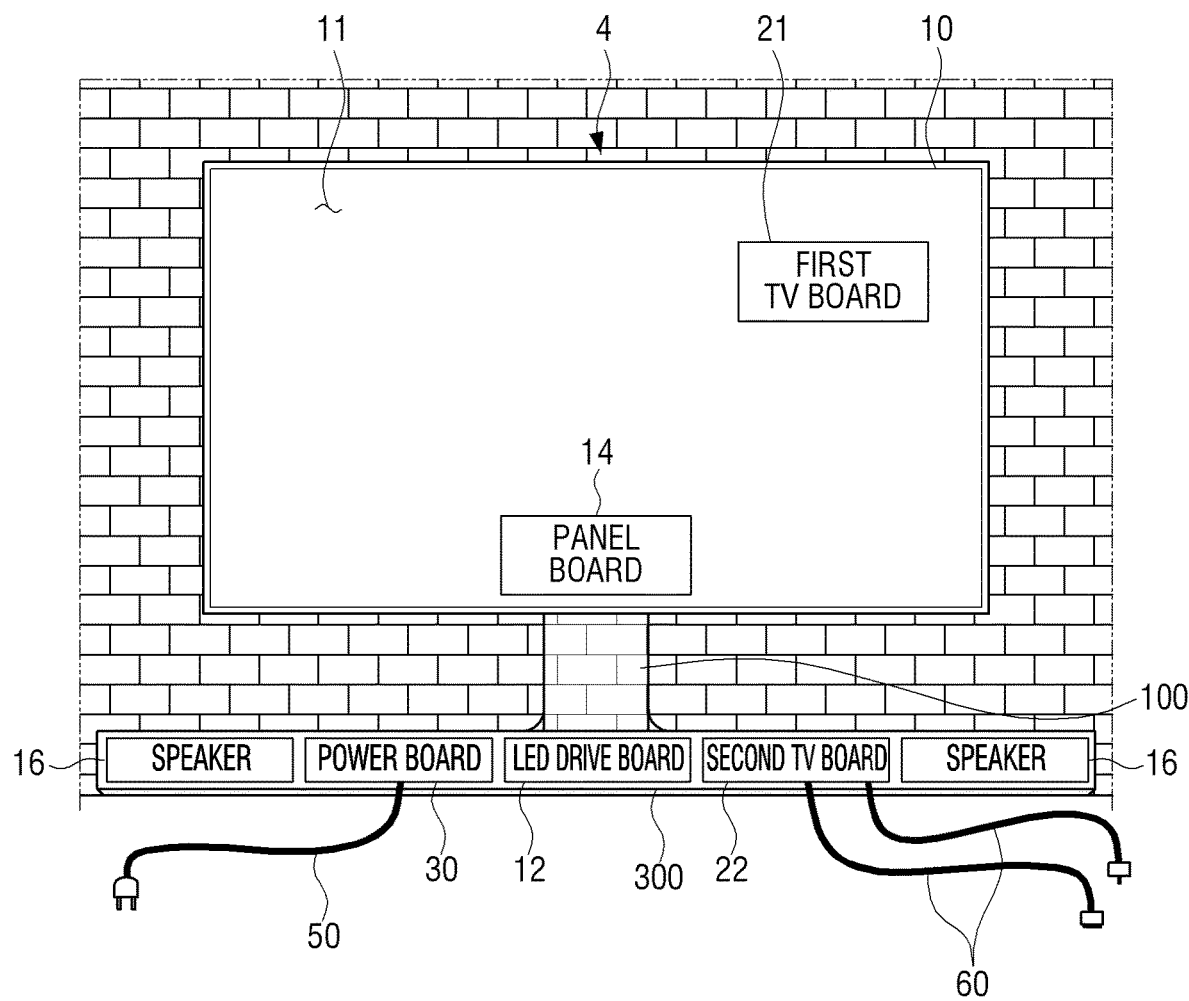
FIG. 10 is a diagram illustrating a display device according to still another embodiment of the present disclosure.

FIG. 10 is a diagram illustrating a display device according to still another embodiment of the present disclosure.

Referring to FIG. 10, in a display device 4 according to still another embodiment of the present disclosure, the power board 30, the LED drive board 12, the second TV board 22, and the speaker 16 may be deployed on the stand 300.

In this case, the support 100 connecting the display main body 10 and the stand 300 to each other is transparently formed, and the support 100 electrically connects the display main body 10 and the stand 300 to each other.

Since parts of circuit boards deployed on the display main body 10 are deployed on the stand 300, and thus a slimmer display main body 10 can be formed. Further, since the power board 30 and the second TV board 22 are deployed on the stand 300, the power cable 50 and the signal cable 60 exposed to the outside are deployed at locations far apart from the screen, and thus the design effect of the display device 4 can be improved.

Further, the stand 300 itself may be used as decorative furniture. The stand 300 on which a plurality of circuit boards are deployed may be formed with a long length. During installation of the display device 4, the stand 300 may be formed to serve as a separate reception space or decorative furniture, and thus indoor interior can be improved.

As described above, in the display devices 1, 2, 3, and 4 according to the present disclosure, at least a part of the power board 30 is deployed on the stand 300, and the display main body 10 and the stand 300 are electrically connected through the transparent support 100. The display main body 10 may receive a supply of the power through the stand 300 and the transparent support 100. The power cable 50 may be deployed on the stand to be invisible to the user's eye, and the support 100 is transparently formed to heighten the viewer's immersion, so that the design formed by the overall external appearance of the display devices 1, 2, 3, and 4 can be heightened.

Figure 11:
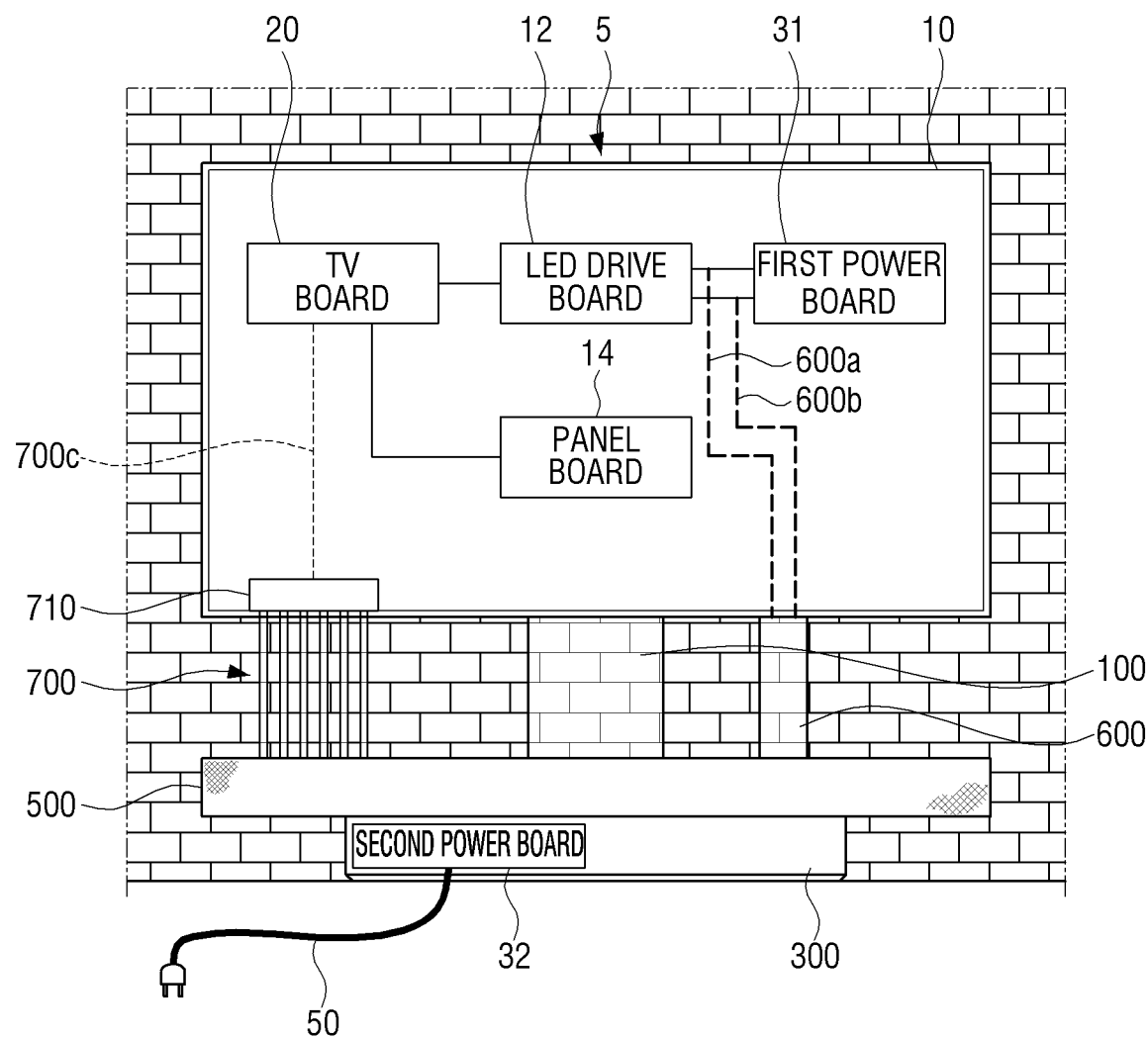
FIG. 11 is a diagram illustrating a display device and a speaker connected to the display device according to an embodiment of the present disclosure.

FIG. 11 is a diagram illustrating a display device and a speaker connected to the display device according to an embodiment of the present disclosure.

Referring to FIG. 11, a display device 5 according to an embodiment of the present disclosure has a structure in which a speaker 500 is separated from a display main body 10. The speaker 500 is coupled to the display main body 10 through first and second cables 600 and 700.

The display main body 10 performs a predetermined function, and may include a display panel for outputting an image and a signal processor (not illustrated).

The speaker 500 outputs sound in accordance with an audio signal output from the display main body 10. The speaker 500 is deployed separately from the display main body 10. The above-described display device 1 (see FIG. 1) is provided with the speaker 16 that is deployed on the display main body, whereas the display device 5 according to this embodiment is provided with the speaker 500 that is deployed outside the display main body 10. Accordingly, in contrast with the display device in the related art, the display main body 10 is not affected by the volume occupied by the speaker 500, and thus a thinner display device can be manufactured as compared with the display device in the related art.

That is, since no speaker is located inside the display main body 10, circuit deployment in the display main body 10 is facilitated, and since the speaker 500 that may act as a vibration source is deployed outside the display main body 10 to be separate from the display main body 10, the display main body 10 is not affected by vibration generated from the speaker 500.

Further, in the display device 5 having the speaker 500 separated from the display main body 10, the speaker 500 can be easily replaced or upgraded in accordance with the user's desired specification.

FIG. 11 illustrates that the speaker 500 is deployed on the stand 300, but is not limited thereto. The speaker 500 may also be deployed on the front surface of the stand 300 or the side surface of the stand 300.

The first cable 600 is a power cable for applying the power from the first power board 31 of the display main body 10 to the speaker 500. Accordingly, the speaker 500 receives a supply of an external power through the display main body 10.

The first cable 600 is transparently formed to be invisible to the user. The first cable 600 includes conducting wires formed of a transparent conductor, and a support body (or coating) formed of a transparent material that surrounds or supports the conducting wire.

The transparent conductor for forming the conducting wires may be made of indium tin oxide (ITO), fluorine tin oxide (FTO), metal mesh, and high polymer. The transparent conductors enumerated as above may have light transmittance of a specific level, and the conducting wires may be formed on one surface (or both surfaces) of the support body through a print or deposition process with a line width of several micrometers.

The support body should have a supporting force for supporting the conducting wires and transparency so that it is invisible to the user. In consideration of the supporting force and the transparency, the support body may be formed of a material, such as polyethylene terephthalate (PET), polycarbonate (PC), polyvinyl alcohol (PVA) film, or glass. The support body may be formed of an insulator.

Since the first cable 600 is transparently formed, it is invisible. Accordingly, the user can heighten the concentration on the image different from the related art in which an opaque cable is connected to the display main body 10.

The first cable 600 connects the display main body 10 and the speaker 500 to transmit the power to the speaker 500 deployed separately from the display main body 10. Specifically, one end of the first cable 600 is connected to the first power board 31 deployed on the inside of the display main body 10, and the other end of the first cable 600 is connected to the DC/DC converter of the speaker 500.

The first power board 31 and the first cable 600 may be connected to each other through a plurality of conducting wires in the display main body 10, and specifically, each of the plurality of conducting wires may be composed of a power line 600*a* and a ground line 600*b*.

The DC power output from the first power board 31 of the display main body 10 may be supplied to the DC/DC converter of the speaker 500, and the DC/DC converter of the speaker 500 may output several DC power outputs required for the speaker 500.

It is exemplarily illustrated that the display device 5 is configured so that the first power board 31 that is a part of the power board 30 is deployed on the display main body 10, and the second power board 32 that is the remainder of the power board 30 is deployed on the stand 300. However, as described above, the deployment of the power board 30 of the display device may be variously changed.

Although it is illustrated that one end of the first cable 600 is connected to the first power board 31 deployed inside the display main body 10, the power boards 30 connected to the first cable 600 have the same configuration, but only the locations at which the power boards 30 are deployed differ from each other. Hereinafter, explanation of the connection of the first cable 600 may substitute for explanation of the connection of the power board 30 deployed in the display main body 10.

The second cable 700 is a signal cable for applying an audio signal from the TV board 20 of the display main body 10 to the speaker 500. Accordingly, the speaker 500 may output sound in accordance with the audio signal supplied from the display main body 10.

The second cable 700 is transparently formed to be invisible to the user. In the same manner as the first cable 600, the second cable 700 includes conducting wires formed of a transparent conductor, and includes a support body (or coating) formed of a transparent material that surrounds or supports the conducting wire.

The conducting wire may be formed of a transparent conductor, such as indium tin oxide (ITO), fluorine tin oxide (FTO), metal mesh, or high polymer, and the support body may be formed of a transparent material, such as polyethylene terephthalate (PET) or glass. The support body may be formed of an insulator.

Since the second cable 700 is transparently formed, it may be invisible. Accordingly, the user can heighten the concentration on the image different from the related art in which an opaque cable is connected to the display main body 10.

The second cable 700 connects the display main body 10 and the speaker 500 to transmit the power to the speaker 500 deployed separately from the display main body 10. Specifically, one end of the second cable 700 is connected to an amplitude integrated circuit (AMP IC) of the TV board 20 deployed on the inside of the display main body 10, and the other end of the second cable 700 is connected to an AMP IC deployed on the speaker 500.

The TV board 20 and the second cable 700 may be connected to each other through a signal line 700*c* inside the display main body 10.

The second cable 700 may include a plurality of signal wirings to transmit an audio signal output from the TV board 20 of the display main body 10 to the speaker 500. For example, according to an inter-ic sound (I2S) transmission method among audio signal transmission methods, the second cable 700 may include a channel selection clock (LRCLK), a bit clock (BCLK), an audio sample data (SDATA) line, a series clock (SCLK), a series data (SDA) control line, and a ground line.

It is illustrated that a plurality of transmission lines of the second cable 700 are separated from each other, but are not limited thereto. The plurality of transmission lines for controlling the speaker 500 may be packaged into one line.

The audio signal output from the TV board 20 of the display main body 10 is supplied to the AMP IC of the speaker 500 through the second cable 700, and the AMP IC of the speaker 500 may output sound corresponding to the audio signal.

On the display main body 10, input/output connectors of external terminals may be provided for interfaces with various kinds of external devices, such as a set-top box, a DVD player, a Blu-ray player, a personal computer (PC), and a home theatre system.

The audio signal may be transmitted from the display main body 10 to the speaker 500 through the connector 710.

Since the display device 5 according to an embodiment of the present disclosure includes the first and second transparent cables 600 and 700, the first and second cables 600 and 700 connected to the speaker 500 become invisible. Accordingly, the problem that a plurality of cables connected to an external speaker 500 in the related art are exposed from the display main body 10 to obstruct viewer's immersion can be solved.

In the case of wirelessly connecting the speaker to the display main body 10, setting may be changed in accordance with the connection method between the display main body 10 and the speaker 500 to cause inconvenience, and a separate power line to supply the power to the speaker is necessary, so that it is difficult to achieve effects of complete cable removal. In order to obtain the same effect as that of a wirelessly connected speaker while solving the problem of the wirelessly connected speaker, the display device 5 according to the present disclosure includes first and second transparent cables 600 and 700. Accordingly, in the display device 5 according to the present disclosure, it is not necessary to separately change the settings in accordance with the connection of the speaker 500, and since the speaker 500 receives the power from the display main body 10, it is not necessary to provide a separate power line. In the display device 5 according to the present disclosure, since the first and second cables 600 and 700 are transparent even if the speaker 500 is exposed to the outside, it is possible to obtain an effect as if the speaker could operate without any separate signal or power cable like a wireless external speaker.

In the display device 5 according to an embodiment of the present disclosure, it is possible to provide an environment in which the viewer can be immersed in the image through lowering of visibility of the first and second cables 600 and 700 connecting the display main body 10 and the speaker 500 to each other.

Figure 12:
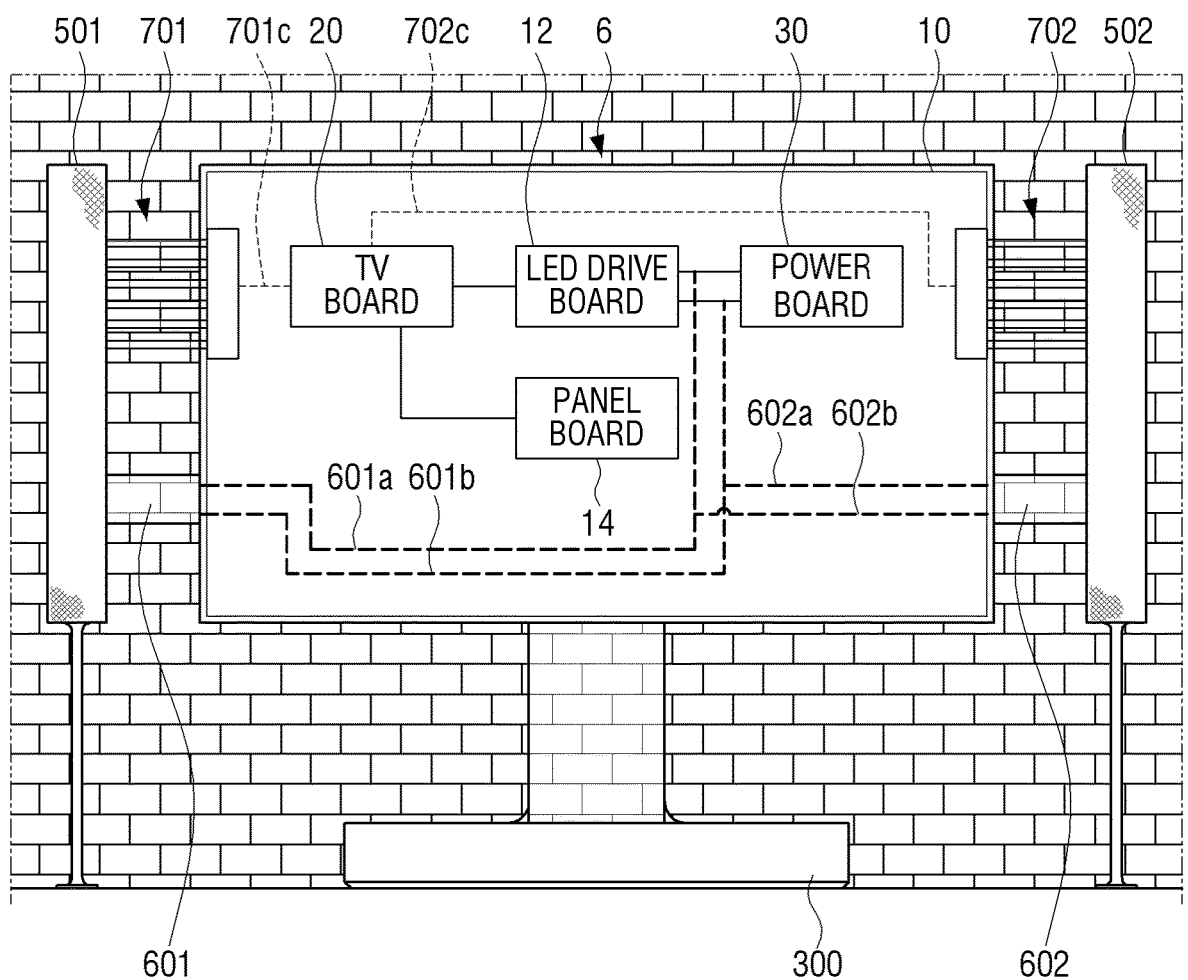
FIGS. 12 to 14 are diagrams illustrating a display system according to various embodiments of the present disclosure.
Figure 13:
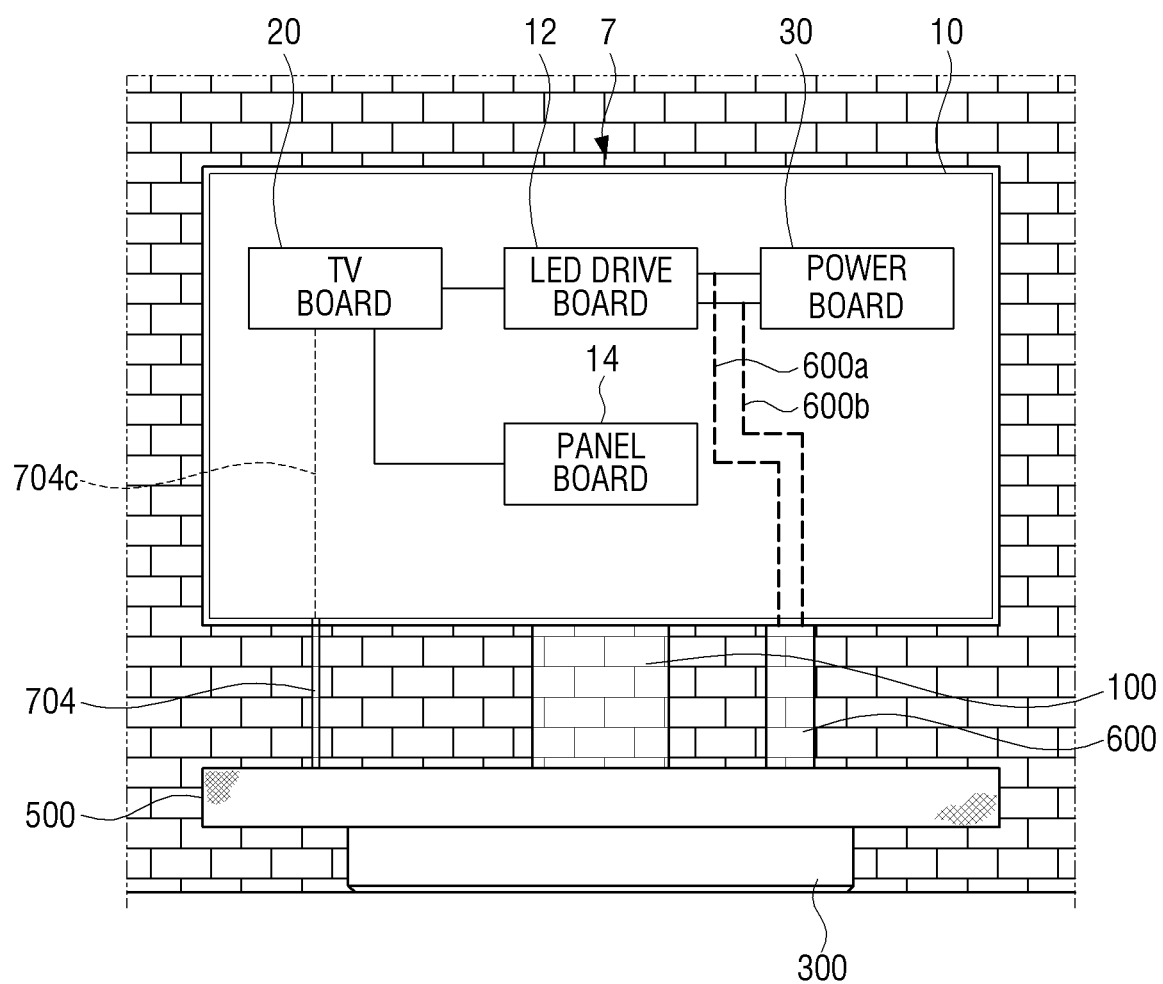
Figure 14:
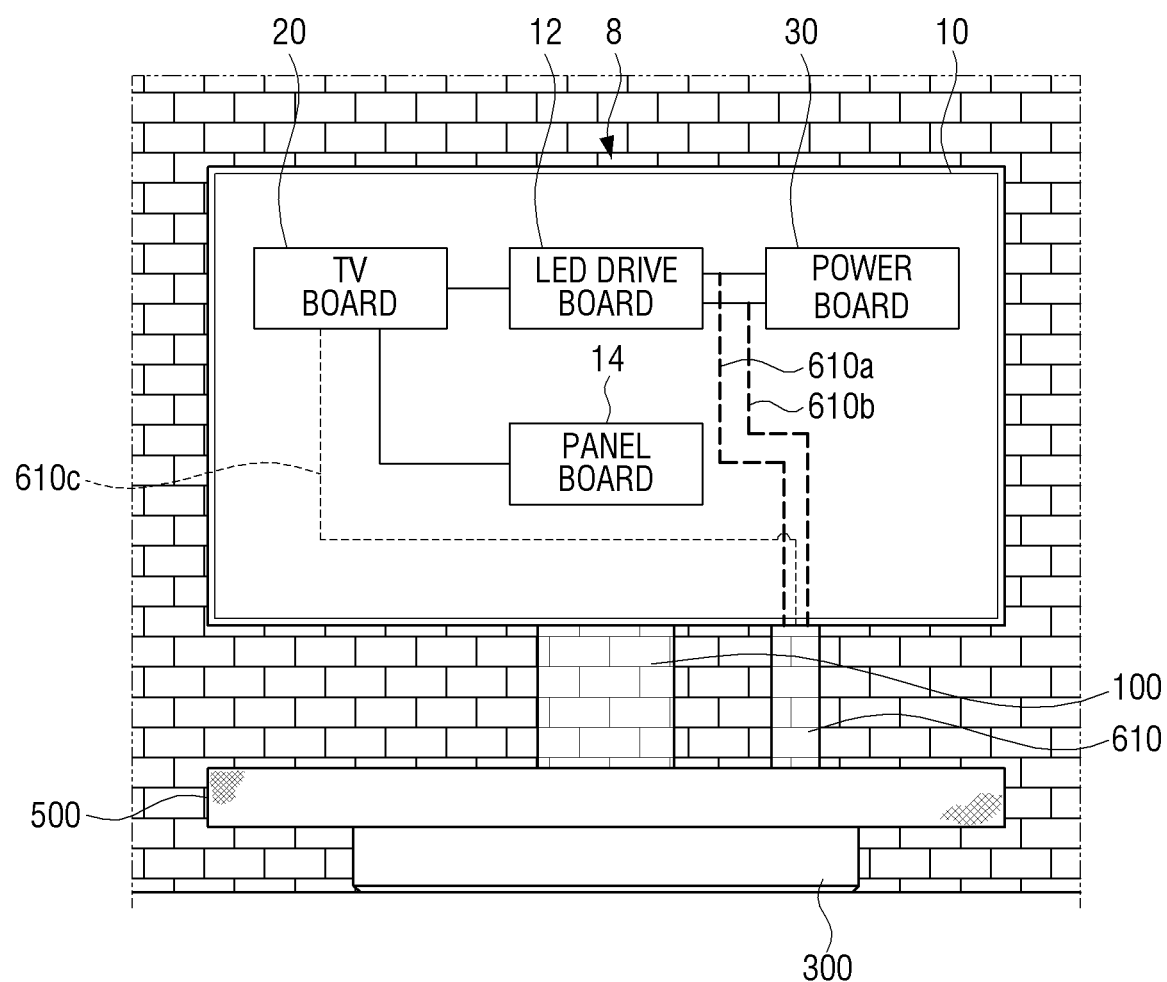

FIGS. 12 to 14 are diagrams illustrating a display system according to various embodiments of the present disclosure.

Referring to FIG. 12, a plurality of speakers 501 and 502 may be provided in a display device 6. The plurality of speakers 501 and 502 may receive a supply of the power through the display main body 10 and the first cables 601 and 602, and may receive an audio signal transmitted through the second cables 701 and 702.

In the display device 6 according to an embodiment of the present disclosure, it is easy to extend to a plurality of speakers 501 and 502. In order to add and register the existing wireless external speakers, special settings, such as Bluetooth, are required, but in the display device 6 according to an embodiment of the present disclosure, the plurality of speakers 501 and 502 can be provided through addition of the first cables 601 and 602 and the second cables 701 and 702.

The plurality of speakers 501 and 502 may be provided and may be deployed separately from the display main body 10. Specifically, the first speaker 501 may be deployed on the left side of the display main body 10, and the second speaker 502 may be deployed on the right side of the display main body 10.

The first speaker 501 is connected to the power board 30 of the display main body 10 through the first cable 601 to receive the power, and is connected to the TV board 20 of the display main body 10 through the second cable 701 to receive the audio signal. In the same manner, the second speaker 502 is connected to the power board 30 of the display main body 10 through the first cable 602, and is connected to the TV board 20 of the display main body 10 through the second cable.

The first cable 601 of the first speaker 501 may be connected to a power line 601a and a ground line 601b in the power board 30 and the display main body 10, and the first cable 602 of the second speaker 502 may be connected to a power line 602a and a ground line 602b.

The second cable 701 of the first speaker 501 may be connected to a signal line 701c in the TV board 20 and the display main body 10, and the second cable 702 of the second speaker 502 may be connected to the TV board 20 and the signal line 702c.

Although it is illustrated that the plurality of speakers 501 and 502 are deployed on both side surfaces of the display main body 10, the deployment of the speakers is not limited thereto, but may be performed at free locations.

Referring to FIG. 13, a second cable 704 for transmitting an audio signal from the display main body 10 of a display device 7 to the speaker 500 may be formed of an optical cable.

The optical cable 704 may be composed of a plurality of optical fibers and a coating surrounding the optical fibers. The optical fiber that is a transmission medium of an optical signal may be transparently formed, and the coating is formed to be penetrated by light, so that the transparent optical cable 704 can be formed.

An electrical signal output through a signal line 704c is converted into an optical signal through a photoelectric converter (not illustrated), and the converted optical signal is converted again into an electrical signal through the photoelectric converter (not illustrated), and the speaker 500 outputs sound corresponding to the electrical signal.

Accordingly, the user can recognize the optical cable 704 as a wall surface or surroundings on which the optical cable 704 is deployed through recognition of light that penetrates the coating in accordance with the user's viewing angle. Accordingly, the optical cable 704 itself may be invisible to the naked eye.

Referring to FIG. 14, in a display device 8 according to another embodiment of the present disclosure, the display main body 10 and the speaker 500 may be connected through one transmission cable 610. The transmission cable 610 may receive not only a power but also an audio signal from the display main body 10. Specifically, the transmission cable 610 is connected to a power line 610a and a ground line 610b in the power board 30 and the display main body 10 to transmit the power, and the transmission cable 610 is connected to the TV board 20 and the signal line 610c to transmit the audio signal.

The transmission cable 610 connects the display main body 10 and the speaker 500 to transmit the power and the audio signal to the speaker 500 that is deployed separately from the display main body 10.

The transmission cable 610 may be formed of a transparent material. Since the transmission cable 610 is transparently formed, it is invisible, and the user can heighten the concentration on the image different from the related art in which an opaque cable is connected to the display main body 10.

Figure 15A:
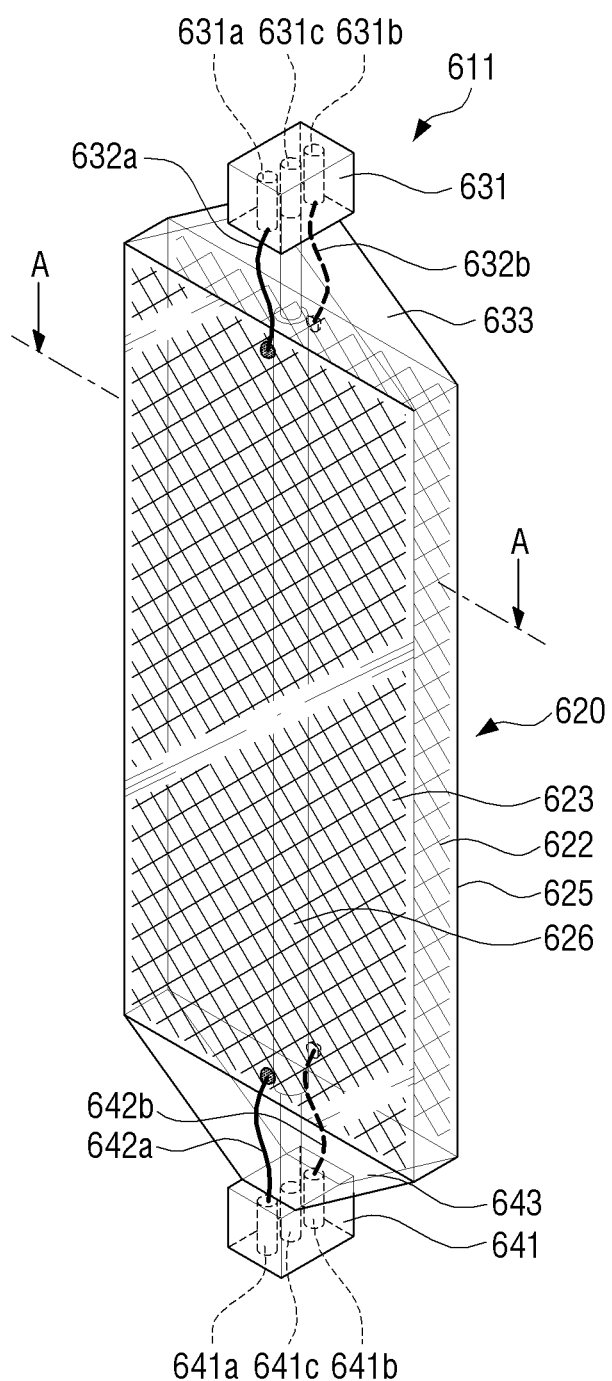
FIGS. 15A and 15B are views illustrating a transmission cable illustrated in FIG. 14 according to an embodiment of the present disclosure.
Figure 15B:
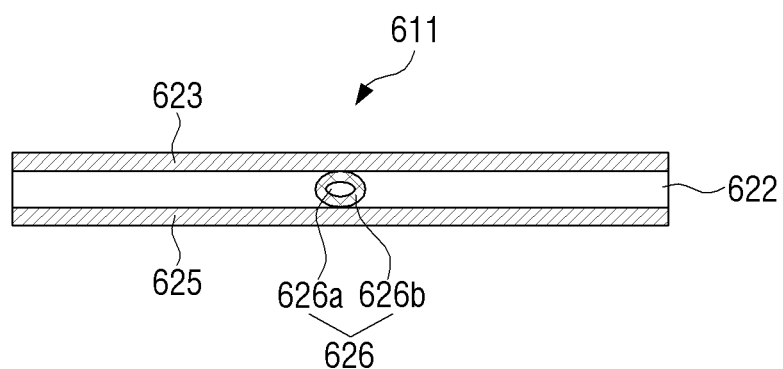

FIGS. 15A and 15B are views illustrating a transmission cable illustrated in FIG. 14 according to an embodiment of the present disclosure.

Referring to FIG. 15A, a transmission cable 611 according to an embodiment of the present disclosure includes a plate 622 formed of a transparent material having power lines 623 and 625 formed of a transparent material and a signal line 626 formed of a transparent material. Further, the transmission cable 611 may further include a pair of terminals 631 and 641 formed at both ends of the plate 622, and the pair of terminals 631 and 641 may be transparently formed.

The plate 622 is formed of an insulator. The plate 622 may be formed to have a vacant space therein. The plate 622 may be formed to have a flat surface on which the power lines 623 and 625 are formed.

The plate 622 is formed of a transparent material that is invisible to a user. The plate 622 may be formed of a material, such as polyethylene terephthalate (PET), polycarbonate (PC), polyvinyl alcohol (PVA) film, or glass.

On external surfaces of the plate 622, a pair of transparent power lines 623 and 625 made of a conductor material may be formed. The pair of power lines 623 and 625 may be separately formed on one surface of the plate 622 or may be formed on both opposite surfaces of the plate 622. The pair of power lines 623 and 625 may be formed to be insulated from each other by the plate 622. Insulating members (not illustrated) may be further provided on the respective power lines to prevent a user from getting shocked.

The transparent conductor for forming the power lines 623 and 625 may be, for example, indium tin oxide (ITO), fluorine tin oxide (FTO), metal mesh, or high polymer. The transparent conductor as described above may have light transmittance of a specific level, and the power lines 623 and 625 may be formed on one surface (or both surfaces) of the plate 622 through a print or deposition process with a line width of several micrometers.

A pair of power lines 623 and 625 may be separately deployed. The power is applied from the display main body 10 to the speaker 500 through the pair of power lines 623 and 625. The power lines 623 and 625 formed on the external surfaces of the plate 622 are connected to power terminals 631*a* and 631*b* of a terminal 631 to be described later through connection lines 632*a* and 632*b*.

The plate 622 may be formed to accommodate therein a signal cable 626 for transferring signals. The plate 622 is formed in a box shape having a roughly rectangular cross section, and the signal cable 626 is deployed in the plate 622. The signal cable 626 may be formed as an optical cable. The signal cable 626 is connected to a signal terminal 631*c* of the terminal 631 to be described later.

At both ends of the plate 622, a first terminal 631 connected to the display main body 10 and the second terminal 641 connected to the speaker 500 are provided.

The first terminal 631 is formed to be inserted into a connector (not illustrated) formed on the display main body 10. If one end of the transmission cable 611 is connected to the display main body 10, the first terminal 631 is inserted into the connector (not illustrated) of the display main body 10, and thus the power lines 623 and 625 and the signal line 626 are electrically connected to the display main body 10.

In the same manner, the second terminal 641 is formed to be inserted into a connector (not illustrated) formed on the speaker 500. If the other end of the transmission cable 611 is connected to the speaker 500, the second terminal 641 is inserted into the connector (not illustrated) of the speaker 500, and thus the power lines 623 and 625 and the signal line 626 are electrically connected to the speaker 500.

The first terminal 631 includes the power terminals 631*a* and 631*b* electrically connected to the power lines 623 and 625 of the plate 622 and the signal terminal 631*c* electrically connected to the signal line 626 of the plate 622, and the second terminal 641 includes the power terminals 641*a* and 641*b* electrically connected to the power lines 623 and 625 of the plate 622 and the signal terminal 641*c* electrically connected to the signal line 626 of the plate 622. The first and second terminals 631 and 641 are formed of an insulator.

The first and second terminals 631 and 641 may be respectively connected to the plate 622 through connection members 633 and 643. The first connection member 633 is formed so that connection lines 632*a* and 632*b* and a part of a signal cable 626 are deployed in the first connection member 633, and in the same manner, the second connection member 643 is formed so that connection lines 642*a* and 642*b* and a part of the signal cable 626 are deployed in the second connection member 643. The connection members 633 and 643 may be formed of an insulator.

Specifically, the pair of power lines 623 and 625 of the plate 622 may be connected to the power terminals 631*a* and 631*b* of the first terminal 631 through the respective connection lines 632*a* and 632*b*, and may be connected to power terminals 641*a* and 641*b* of the second terminal 641 through the connection lines 642*a* and 642*b*. The connection lines 632*a*, 632*b*, 642*a*, and 642*b* may be made of a conductor, such as copper, and may be deployed inside the connection members 633 and 643. Further, the signal line 626 of the plate 622 is connected to the signal terminals 631*c* and 641*c* of the first and second terminals 631 and 641. The signal cable 626 that is a signal line may be formed to extend from the insides of the connection members 633 and 643 to the first and second terminals 631 and 641.

An insulator may fill in the connection members 633 and 641 except for portions in which the power lines 623 and 625 of the plate 622 are adjacent to the connection lines 632 and 642 and portions in which the power terminals of the first and second terminals 631 and 641 are adjacent to the connection lines thereof, that is, portions in which the connection lines 632 and 642 are connected.

The transmission cable 611 according to an embodiment of the present disclosure may supply both the power and the audio signal between the display main body 10 and the speaker 500. The transmission cable 611 is a cable in which the power line and the signal line are integrated, and thus has spatial merits on the point that it is not required to provide a plurality of cables to supply the power and the signal.

Referring to FIG. 15B, the transmission cable 611 has a structure in which the plate 622 including the first power line 623 and the signal line 626 therein and the second power line 625 are deployed to be laminated.

The plate 622 is in the form of a tube having a space formed therein, and the signal cable 626 for transmitting signals is deployed inside the plate 622. The remaining space excluding the signal cable 626 in the plate may be filled with air or an insulator.

On the external surfaces of the plate 622, a pair of power lines 623 and 625 for supplying signals is formed. The first power line 623 may be formed on one surface of the plate 622, and the second power line 625 may be formed on the other surface of the plate 622 that is opposite to the one surface thereof.

The power lines 623 and 625 may be formed in a metal mesh method in which a lattice pattern is made on the plate 622 and a metal having a low resistance value, such as silver or copper, is finely spread on the plate 622 like a net to print electrodes.

The signal line 626 may be formed as an optical cable 626 including a core 626*a* and a core cover 626*b*. The core 626*a* is to transmit an optical signal, and has a relatively high refraction index. The optical signal is totally reflected along a length direction in the core 626*a*. The core cover 626*b* confines the optical signal in the core 626*a*, and is deployed on the outside of the core 626*a* with a relatively low refraction index. The core cover 626*b* is formed to completely surround the core 626*a* along the outer circumference of the core 626*a*. The optical cable 626 transmits the audio signal output from the display main body 10 to the speaker.

Figure 16A:
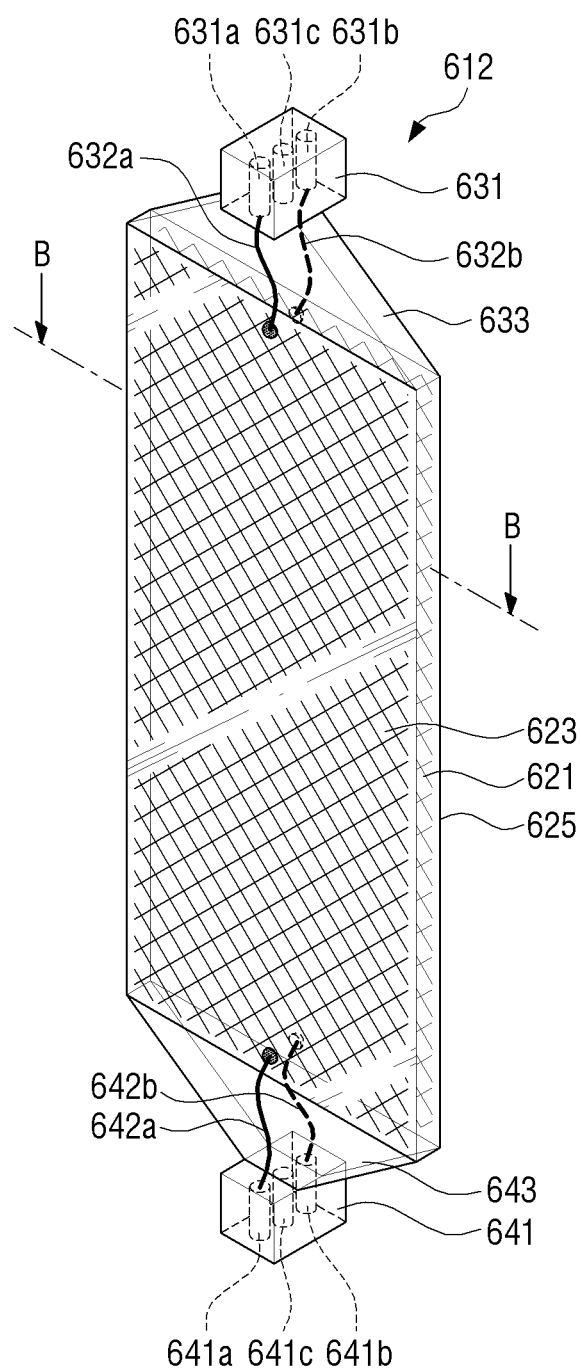
FIGS. 16A and 16B are views illustrating a transmission cable illustrated in FIG. 14 according to another embodiment of the present disclosure.
Figure 16B:
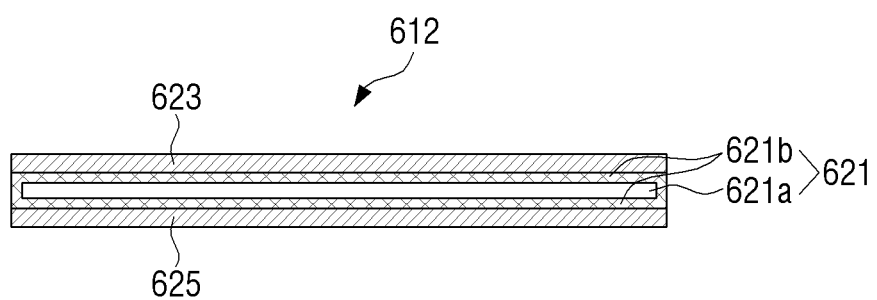

FIGS. 16A and 16B are views illustrating a transmission cable illustrated in FIG. 14 according to another embodiment of the present disclosure.

Referring to FIGS. 16A and 16B, a transmission cable 612 according to another embodiment of the present disclosure includes a plate 621 including power lines 623 and 625 and a signal line 621 and a pair of terminals 631 and 641 formed at both ends of the plate 621.

In contrast with the transmission cable 611 in which the signal cable 626 is accommodated in the plate 621 as illustrated in FIGS. 15A and 15B, in the transmission cable 612 as illustrated in FIGS. 16A and 16B, the plate 621 is composed of a core 621*a* and a core cover 621*b* deployed on the outside of the core 621*a* so that the plate 621 itself transmits an audio signal from the display main body 10 to the speaker 500. That is, FIGS. 16A and 16B illustrate an example of the transmission cable 612 in which the plate 621 itself becomes an optical cable.

The plate 621 may be formed in a box shape having a roughly rectangular cross section, and an optical cable including the core 621a and the core cover 621b therein may be formed in the plate 621. The core 621a and the core cover 621b are formed of a transparent material.

In the center of the plate 621, the core 621a, in which an optical signal is totally reflected and proceeds along the length direction, is formed, and along the outer circumference of the core 621a, the core cover 621b is formed to completely surround the core 621a. The core cover 621b may be formed to form an outermost portion in the plate 621.

The plate 621 may further include a transparent coating layer (not illustrated) surrounding the core cover 621b at the outermost portion. In this case, the coating layer (not illustrated) is formed of a transparent material. The plate 621 has the shape and the function of the optical cable, and transmits the audio signal output from the display main body 10 to the speaker 500.

The transmission cable 612 includes a pair of power lines 623 and 625 made of a transparent conductor and formed on the external surfaces of the plate 621. The power is transmitted from the display main body 10 to the speaker 500 through the pair of power lines 623 and 625.

The plate 621 including the signal line 621 and the power lines 623 and 625 may be formed of a material having high light transmittance and thus can lower visibility of the transmission cable 612.

The foregoing exemplary embodiments and advantages are merely exemplary and are not to be construed as limiting the present disclosure. The present teaching can be readily applied to other types of apparatuses. Also, the description of the exemplary embodiments of the present disclosure is intended to be illustrative, and not to limit the scope of the claims, and many alternatives, modifications, and variations will be apparent to those skilled in the art.

What is claimed is:

1. A display device comprising:
   a display main body;
   a stand; and
   a support configured to connect the display main body and the stand, the support being made of a transparent material and provided with a transparent conducting cable positioned at an internal portion of the support,
   wherein the display main body is configured to receive a power supply through the stand and the transparent conducting cable provided in the support.

2. A display device comprising:
   a display main body;
   a stand; and
   a support configured to connect the display main body and the stand, the support being made of a transparent material and provided with a transparent conducting cable,
   wherein the display main body is configured to receive a power supply through the stand and the transparent conducting cable provided in the support,
   wherein the support comprises:
   a body made of a body insulator;
   the transparent conducting cable deployed to the body, the transparent conducting cable being made of an electrical conductor; and
   a cover made of a cover insulator surrounding the transparent conducting cable.

3. The display device as claimed in claim 2, wherein the transparent conducting cable is inserted and deployed in the body.

4. The display device as claimed in claim 2, wherein the transparent conducting cable is deployed on a surface of the body.

5. The display device as claimed in claim 2, wherein the body and the cover are transparently formed.

6. The display device as claimed in claim 2, wherein both ends of the transparent conducting cable are exposed, and wherein metal electrodes are formed at the both ends of the transparent conducting cable.

7. The display device as claimed in claim 1, wherein a part of a power board is deployed in the display main body, and
   a remainder of the power board is deployed in the stand.

8. The display device as claimed in claim 7, wherein the stand is connected to a power cable configured to supply power from an external power supply.

9. The display device as claimed in claim 1, wherein a power board is deployed in the stand.

10. A display device comprising:
    a display main body;
    a stand; and
    a support configured to connect the display main body and the stand, the support being made of a transparent material and provided with a transparent conducting cable,
    wherein the display main body is configured to receive a power supply through the stand and the transparent conducting cable provided in the support,
    wherein a part of a TV board is deployed in the display main body, and
    a remainder of the TV board is deployed in the stand.

11. The display device as claimed in claim 10, wherein the stand is connected to a TV signal cable configured to transmit a TV signal.

12. The display device as claimed in claim 10, wherein the part of the TV board deployed in the display main body and a part of the remainder of the TV board deployed in the stand are connected to each other through a transparent optical cable.

13. The display device as claimed in claim 12, wherein the stand further comprises an optical cable accommodation groove concavely formed on a surface of a body of the stand, wherein the transparent optical cable is accommodated therein.

14. The display device as claimed in claim 2, wherein a first mount groove formed on the display main body is coupled to one end of the support and a second mount groove formed on the stand is coupled to another end of the support,
    a first connection terminal is deployed in the first mount groove, and
    a second connection terminal is deployed in the second mount groove.

15. A display device comprising:
    a display main body;
    a stand; and
    a support configured to connect the display main body and the stand, the support being made of a transparent material and provided with a transparent conducting cable,
    wherein the display main body is configured to receive a power supply through the stand and the transparent conducting cable provided in the support, wherein the display device further comprises:
- a speaker deployed separately from the display main body; and
- a transparent transmission cable configured to transmit power and a signal from the display main body to the speaker.

16. The display device as claimed in claim 15, wherein the transparent transmission cable comprises:
    - a transparent plate made of an insulator; and
    - a transparent power line deployed on a surface of the transparent plate,
    - wherein the transparent plate includes a core configured to transmit an optical audio signal from the display main body to the speaker, and a core cover deployed on an outside of the core.

17. The display device as claimed in claim 16, wherein the transparent plate includes a first surface and a second surface, and;
    - wherein the transparent power line is deployed on one surface or both surfaces of the first surface and the second surface of the transparent plate.

18. The display device as claimed in claim 15, wherein the transparent transmission cable comprises:
    - a transparent plate made of an insulator; and
    - a transparent power line deployed on a surface of the transparent plate,
    - wherein an optical audio cable configured to transmit an optical audio signal is inserted and deployed inside the transparent plate in order to transmit the signal from the display main body to the speaker.

19. The display device as claimed in claim 15, wherein the transparent transmission cable comprises:
    - a first transparent cable configured to supply power from the display main body to the speaker; and
    - a second transparent cable configured to transmit the signal from the display main body to the speaker.

20. The display device as claimed in claim 19, wherein the first transparent cable comprises a transparent conducting wire and a transparent support body configured to support the transparent conducting wire.

* * * * *